(12) United States Patent
Kim et al.

(10) Patent No.: US 12,516,409 B2
(45) Date of Patent: Jan. 6, 2026

(54) MASK ASSEMBLY AND METHOD OF REPAIRING THE SAME

(71) Applicant: Samsung Display Co., Ltd., Yongin-si (KR)

(72) Inventors: Jeongkuk Kim, Suwon-si (KR); Hwi Kim, Suwon-si (KR); Youngmin Moon, Yongin-si (KR); SeungYong Song, Suwon-si (KR); Areum Lee, Suwon-si (KR); Eunbee Jo, Hwaseong-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 568 days.

(21) Appl. No.: 17/961,645

(22) Filed: Oct. 7, 2022

(65) Prior Publication Data

US 2023/0146922 A1 May 11, 2023

(30) Foreign Application Priority Data

Nov. 8, 2021 (KR) .................... 10-2021-0152323

(51) Int. Cl.
*C23C 14/04* (2006.01)
*H10K 71/16* (2023.01)
*H10K 71/00* (2023.01)

(52) U.S. Cl.
CPC ......... *C23C 14/042* (2013.01); *H10K 71/166* (2023.02); *H10K 71/00* (2023.02)

(58) Field of Classification Search
CPC ..... C23C 14/042; C23C 14/044; C23C 16/04; C23C 16/042; C23C 18/06; C23C 18/1605; C23C 2/0062; H10K 71/166
See application file for complete search history.

(56) References Cited

U.S. PATENT DOCUMENTS

| 9,748,485 | B2 | 8/2017 | Lee | |
| 10,035,162 | B2* | 7/2018 | Mizumura | H10K 71/164 |
| 2003/0108805 | A1* | 6/2003 | Clark | H01L 21/682 |
| | | | | 430/22 |
| 2006/0014087 | A1* | 1/2006 | Wittenberg | G02B 5/201 |
| | | | | 430/7 |
| 2020/0199732 | A1* | 6/2020 | Kudo | B23K 26/38 |

FOREIGN PATENT DOCUMENTS

| KR | 20060106146 A | 10/2006 |
| KR | 20170045427 A | 4/2017 |
| KR | 10-1867467 | 6/2018 |
| KR | 10-2019-0138256 | 12/2019 |
| KR | 10-2083947 | 4/2020 |
| KR | 10-2252005 | 5/2021 |

* cited by examiner

*Primary Examiner* — Joseph A Miller, Jr.

(74) *Attorney, Agent, or Firm* — CANTOR COLBURN LLP

(57) ABSTRACT

A repairing method of a mask assembly includes providing a mask assembly including a frame, an open mask including a first opening disposed on an upper surface of the frame, and a first unit mask including a plurality of first deposition openings to overlap the first opening in a plan view and disposed on an upper surface of the open mask, first cutting the open mask at an outside of the first unit mask such that a second opening having a size greater than a size of the first opening is defined, and connecting the second unit mask including a plurality of second deposition openings corresponding to the plurality of first deposition openings to the first cut open mask.

16 Claims, 17 Drawing Sheets

MASK ASSEMBLY AND METHOD OF REPAIRING THE SAME

CROSS REFERENCE TO RELATED APPLICATION(S)

This application claims priority to and benefits of Korean Patent Application No. 10-2021-0152323 under 35 U.S.C. § 119, filed on Nov. 8, 2021, in the Korean Intellectual Property Office (KIPO), the disclosure of which is incorporated by reference herein in its entirety.

BACKGROUND

1. Technical Field

The disclosure relates to a mask assembly with improved deposition reliability and a method of repairing the mask assembly.

2. Description of the Related Art

In general, a light emitting display device includes pixels and light emitting elements disposed in the pixels. Each light emitting element includes a light emitting layer disposed between two electrodes. The light emitting layers included in the pixels are grouped in multiple groups.

A mask assembly is used to deposit the multiple light emitting layers on a work substrate. The mask assembly includes a frame, an open mask, and a mask provided in the unit of a cell. Patterned light emitting layers are formed by placing the work substrate on the mask and depositing a light emitting material on the work substrate. Recently, in order to manufacture a large-area display device, a facility to manufacture a large-area mask and a technology for a repair method thereof are being developed.

SUMMARY

The disclosure provides a mask assembly capable of readily separating a defective unit mask from an open mask and reducing a damage of the open mask in the process of separating the defective unit mask from the open mask.

The disclosure provides a method of repairing the mask assembly.

Embodiments of the disclosure provide a method of repairing a mask assembly. The repairing method may include providing a mask assembly including a frame, an open mask including a first opening, the open mask disposed on an upper surface of the frame, and a first unit mask including a plurality of first deposition openings overlapping the first opening in a plan view, the first unit mask disposed on an upper surface of the open mask, first cutting the open mask at an outside of the first unit mask such that a second opening having a size greater than a size of the first opening is defined, and connecting a second unit mask including a plurality of second deposition openings corresponding to the plurality of first deposition openings to the first cut open mask.

The first unit mask may be separated from the mask assembly by the first cutting of the open mask.

The open mask may be cut in a direction from the upper surface to a lower surface of the open mask or from the lower surface to the upper surface of the open mask by the first cutting of the open mask.

The first cutting of the open mask may be performed by a laser cutting process.

The method may further include second cutting the first cut open mask at an outside of the second unit mask to have a third opening having a size greater than the size of the second opening after the connecting of the second unit mask to the first cut open mask.

The open mask may include a first portion with the first opening, and a second portion surrounding the first portion and having a thickness greater than a thickness of the first portion in a thickness direction of the open mask and the first unit may be disposed on the first portion. In the first cutting of the open mask, a portion of the first portion may cut and separated from the mask assembly.

The first portion may have a length in a range of about 300 micrometers to about 2 millimeters in a cross sectional view.

The first portion may have the thickness equal to or smaller than about 100 micrometers in the thickness direction.

In the first cutting of the open mask, at least one of an inner side surface of the first unit mask which defines the plurality of first deposition openings, a lower surface of the first unit mask which is in contact with the open mask, and an upper surface of the first unit mask which is opposite to the lower surface, is damaged or a deposition material is accumulated in some of the plurality of first deposition openings.

The method may further include manufacturing the mask assembly before the providing of the mask assembly. The manufacturing of the mask assembly may include disposing a first preliminary unit mask including a first deposition area including the plurality of first deposition openings and a first peripheral area surrounding the first deposition area on the open mask, connecting the first preliminary unit mask to the open mask such that a first welding protrusion is formed on a lower surface of the open mask adjacent to the first opening, and cutting the first preliminary unit mask along a first trimming line defined in the first peripheral area to form the first unit mask. The first trimming line may be a closed line surrounding the first deposition area in a plan view.

The open mask may include a first portion including the first opening and a second portion surrounding the first portion and having a thickness greater than a thickness of the first portion in a thickness direction of the open mask, and the first unit may be disposed on the first portion. The first trimming line may be defined between a portion overlapping the first welding protrusion in a plan view and a boundary of the first portion and the second portion.

The first preliminary unit mask may be disposed such that the first peripheral area is covered by the open mask when viewed from under the lower surface of the open mask.

The first preliminary unit mask may have a quadrangular shape extending in a first direction and a second direction intersecting the first direction in a plan view and may be connected to the open mask after being tensioned in at least one direction of the first and second directions.

The connecting of the second unit mask to the first cut open mask may include disposing a second preliminary unit mask including a second deposition area including the plurality of second deposition openings and a second peripheral area surrounding the second deposition area on the first cut open mask, connecting the second preliminary unit mask to the first cut open mask such that a second welding protrusion is formed on the lower surface of the first cut open mask adjacent to the second opening, and cutting the second preliminary unit mask along a second trimming line defined in the second peripheral area to form the second unit mask. The second trimming line may be a closed line surrounding the second deposition area in a plan view.

The open mask may include a first portion including the first opening, and a second portion surrounding the first portion and having a thickness greater than a thickness of the first portion and the first unit mask may be disposed on the first portion. The second trimming line may be defined between a portion overlapping the second welding protrusion in a plan view and a boundary of the first portion and the second portion.

The first preliminary unit mask and the second preliminary unit mask may have a same length in a cross-sectional view.

Embodiments of the disclosure provide a mask assembly that may include a frame, at least one open mask disposed on an upper surface of the frame and including a first portion including an at least one opening and a second portion surrounding the first portion, at least one unit mask disposed on an upper surface of the at least one open mask and including a deposition area including deposition openings that overlap the at least one opening in a plan view and a peripheral area surrounding the deposition area and overlapping the first portion in a plan view, and at least one welding protrusion disposed on a lower surface of the at least one open mask, adjacent to the at least one opening, and overlapping the peripheral area in a plan view. The first portion may have a thickness smaller than a thickness of the second portion in a thickness direction of the at least one open mask.

The at least one welding protrusion may include a plurality of welding protrusions, and the plurality of welding protrusions surround the at least one opening.

The thickness of the first portion may be equal to or smaller than about 100 micrometers in the thickness direction.

The at least one open mask may include a plurality of open masks, the at least one unit mask may include a plurality of unit masks, the at least one opening may include a plurality of openings, the plurality of open masks may be arranged in a direction, the plurality of openings of each of the at least one open masks may be arranged in a direction perpendicular to the direction in which the plurality of open masks are arranged, and the plurality of unit masks may be disposed to respectively correspond to the plurality of openings.

According to the above, a deposition yield and a deposition reliability of the mask assembly may be improved. It is also possible to replace the unit mask multiple times, and thus, a production yield of a display panel may be enhanced.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
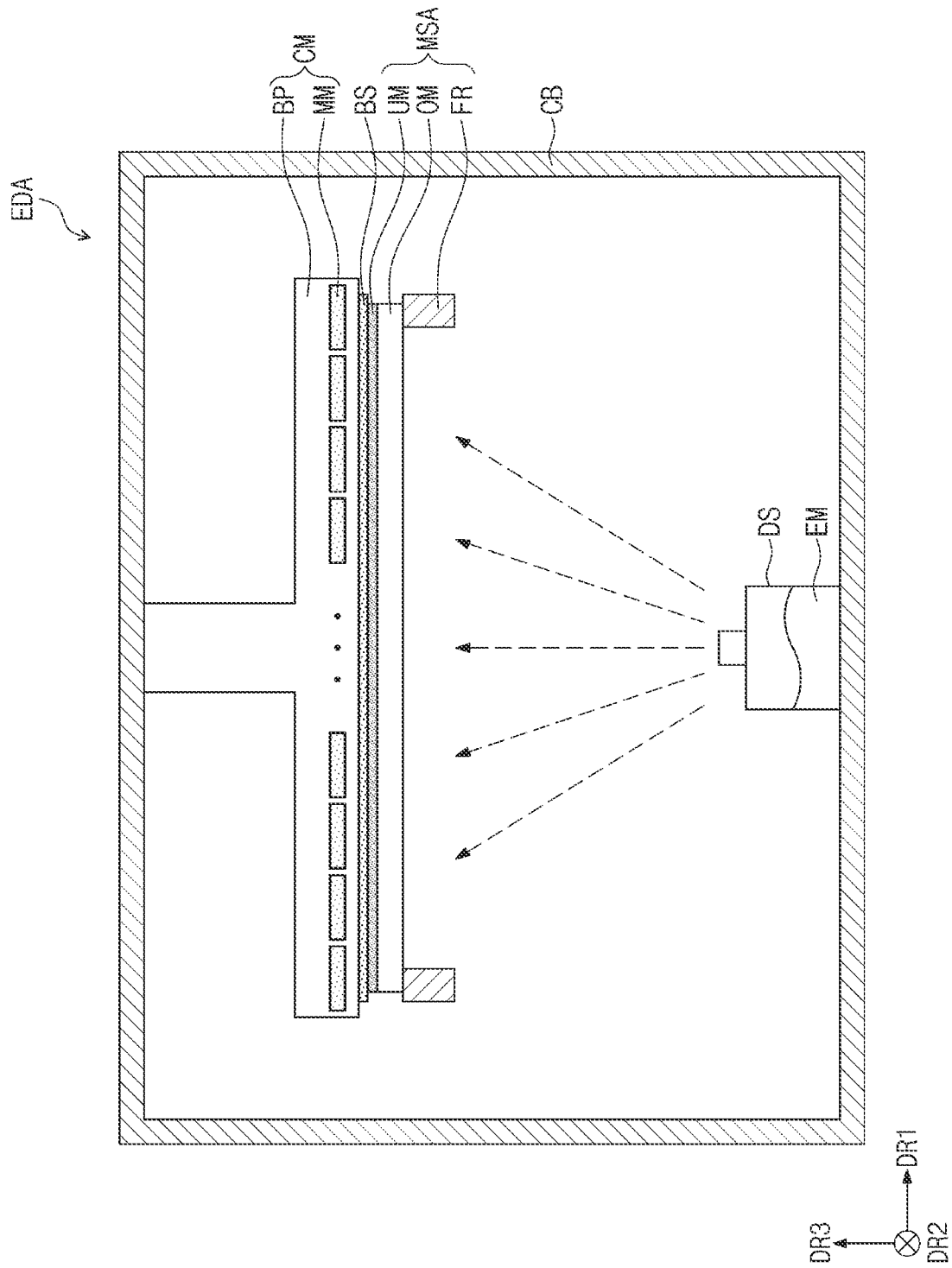
FIG. 1 is a schematic cross-sectional view of a deposition apparatus according to an embodiment of the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the disclosure will be explained in detail with reference to the accompanying drawings.

FIG. 1 is a schematic cross-sectional view of a deposition apparatus EDA according to an embodiment of the disclosure.

Referring to FIG. 1, the deposition apparatus EDA may include a deposition chamber CB, a fixing member CM, a deposition source DS disposed in the deposition chamber CB, and a mask assembly MSA disposed in the deposition chamber CB. Although not shown in figures, the deposition apparatus EDA may further include additional mechanical apparatuses to implement an inline system.

A deposition condition of the deposition chamber CB may be set to a vacuum state. The deposition chamber CB may include a bottom surface, a ceiling surface, and sidewalls. The bottom surface of the deposition chamber CB may be substantially parallel to a plane defined by a first direction DR1 and a second direction DR2. A third direction DR3 may indicate a normal line direction of the bottom surface of the deposition chamber CB.

The fixing member CM may be disposed in the deposition chamber CB, may be disposed above the deposition source DS, and may fix the mask assembly MSA. The fixing member CM may be installed at the ceiling surface of the deposition chamber CB. The fixing member CM may include a jig or a robot arm to hold the mask assembly MSA.

The fixing member CM may include a body portion BD and magnetic substances MM coupled to the body portion BD. The body portion BD may include a plate as a base structure to fix the mask assembly MSA, however, it should not be particularly limited. The magnetic substances MM may be disposed inside or outside of the body portion BD. The magnetic substances MM may fix the mask assembly MSA using a magnetic force, and thus, a base substrate BS may be tightly adhered to the mask assembly MSA.

The deposition source DS may evaporate a deposition material EM, e.g., a light emitting material, and may spray the evaporated deposition material as a vapor. The sprayed deposition material EM may be deposited on the base substrate BS in a pattern after passing through the mask assembly MSA. The base substrate BS may correspond to a substrate in an intermediate stage of manufacturing a display panel DP described with reference to FIG. 11.

The mask assembly MSA may be disposed in the deposition chamber CB and may be disposed above the deposition source DS. The mask assembly MSA may support the base substrate BS that is disposed on the mask assembly MSA.

In the embodiment, the mask assembly MSA may include a frame FR, an open mask OM, and a unit mask UM. The unit mask UM may be a mask that is used to perform a deposition process on the display panel DP (refer to FIG. 11) in the unit of a cell. This will be described in detail later.

The base substrate BS may be disposed between the mask assembly MSA and the fixing member CM. The base substrate BS may include a glass substrate or a plastic substrate. The base substrate BS may include a polymer layer disposed on the glass substrate or the plastic substrate. The base substrate BS may be provided as a base surface of a layer formed by the deposition apparatus EDA. Accordingly, the base substrate BS is a component of the display panel DP and should not be particularly limited as long as the base substrate BS is disposed under a component that is formed by the deposition process (refer to FIG. 11) described later. The base substrate BS may be removed from the display panel DP after a manufacturing process of the display panel DP is completed, however, it should not be particularly limited.

Figure 2:
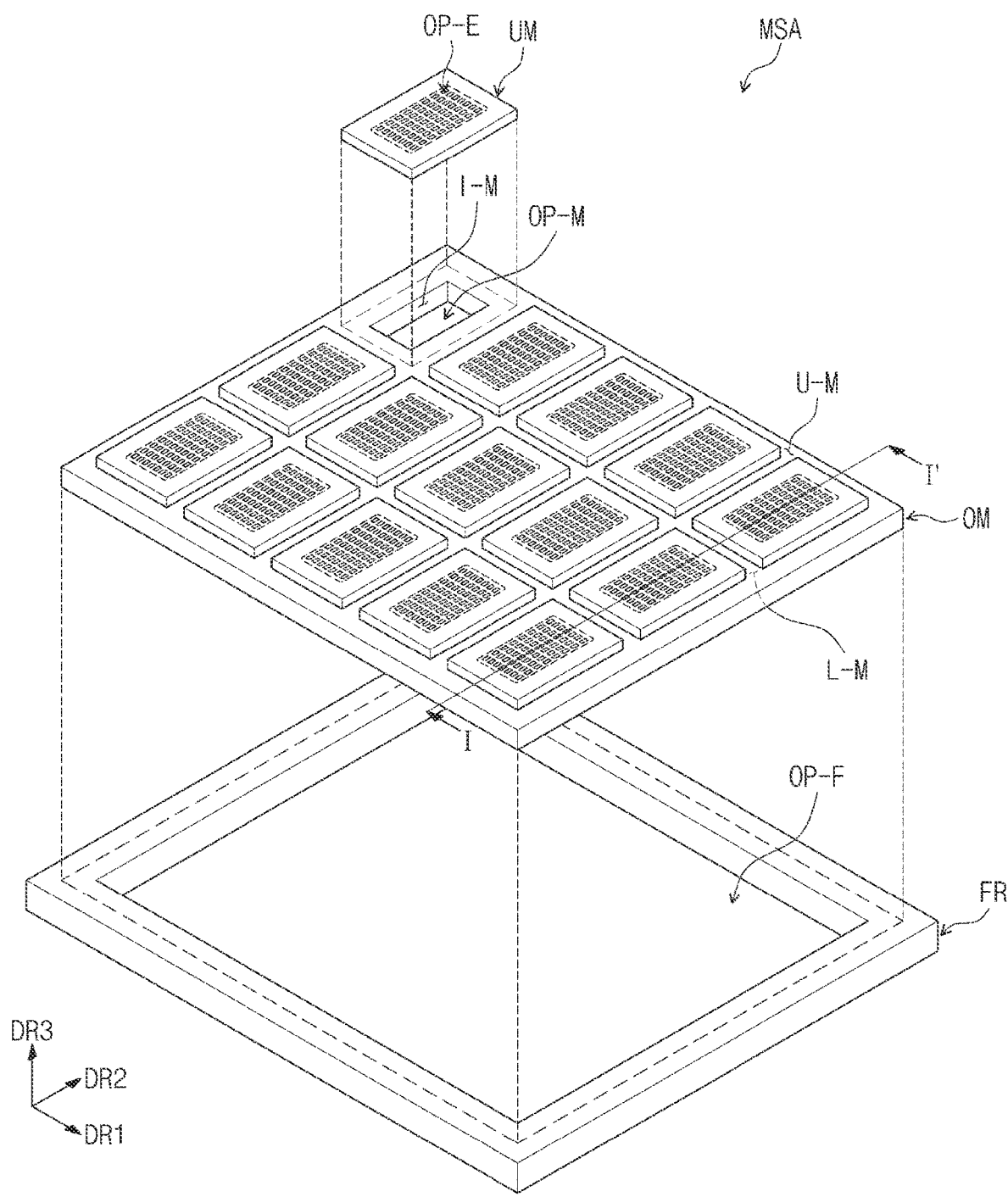
FIG. 2 is an exploded perspective view of a mask assembly according to an embodiment of the disclosure.
Figure 3A:
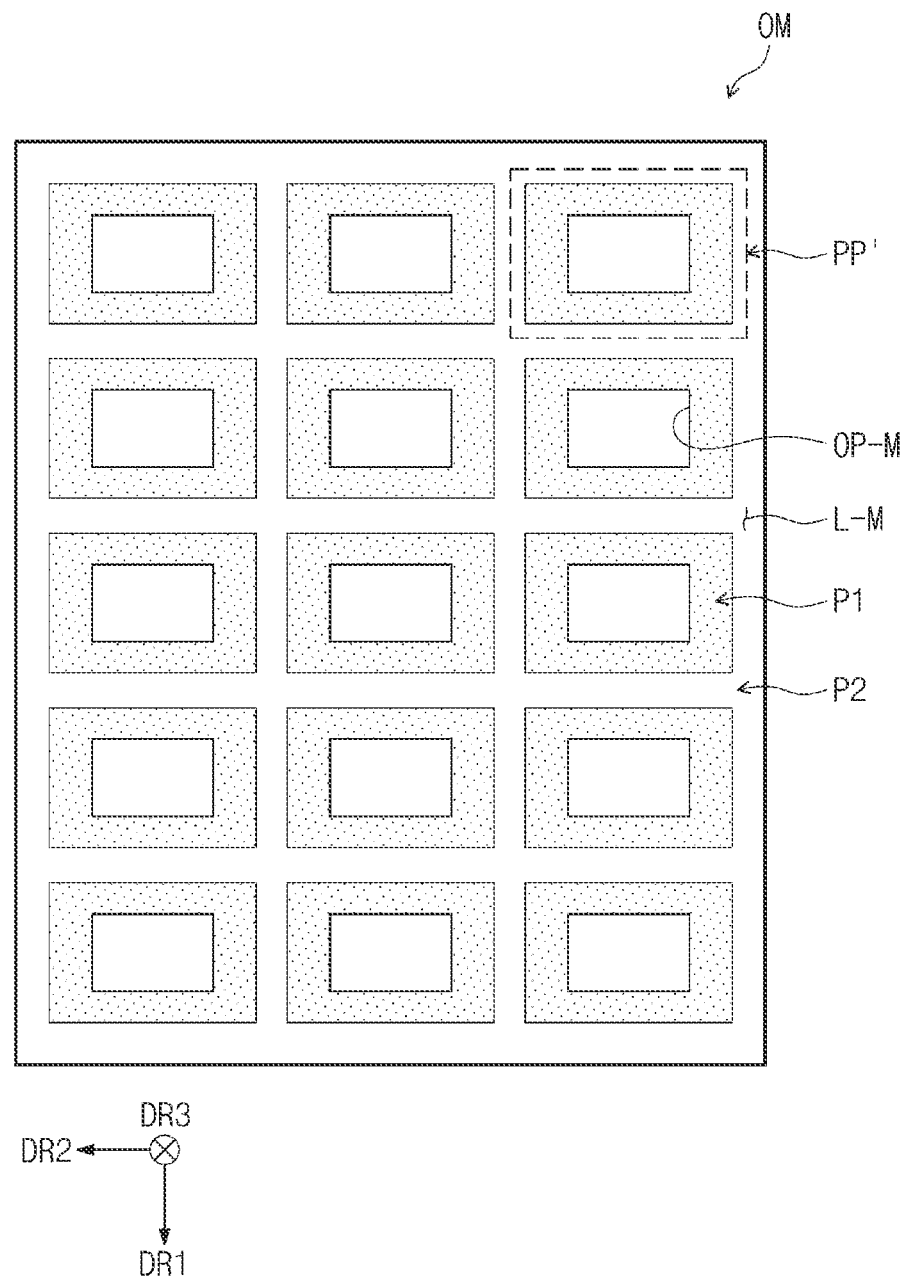
FIG. 3A is a plan view of an open mask according to an embodiment of the disclosure.
Figure 3B:
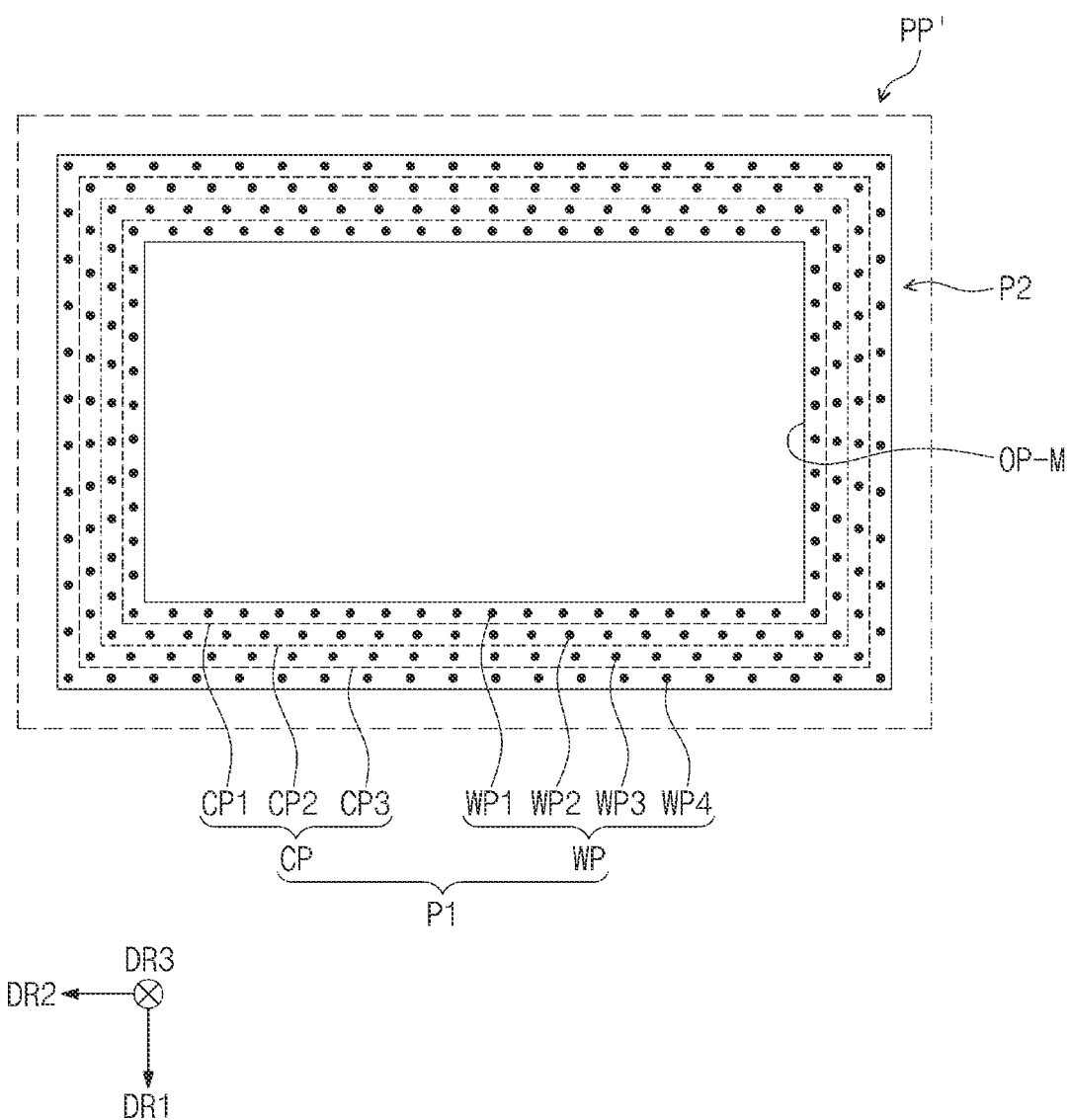
FIG. 3B is an enlarged plan view of area PP' of FIG. 3A.
Figure 4:
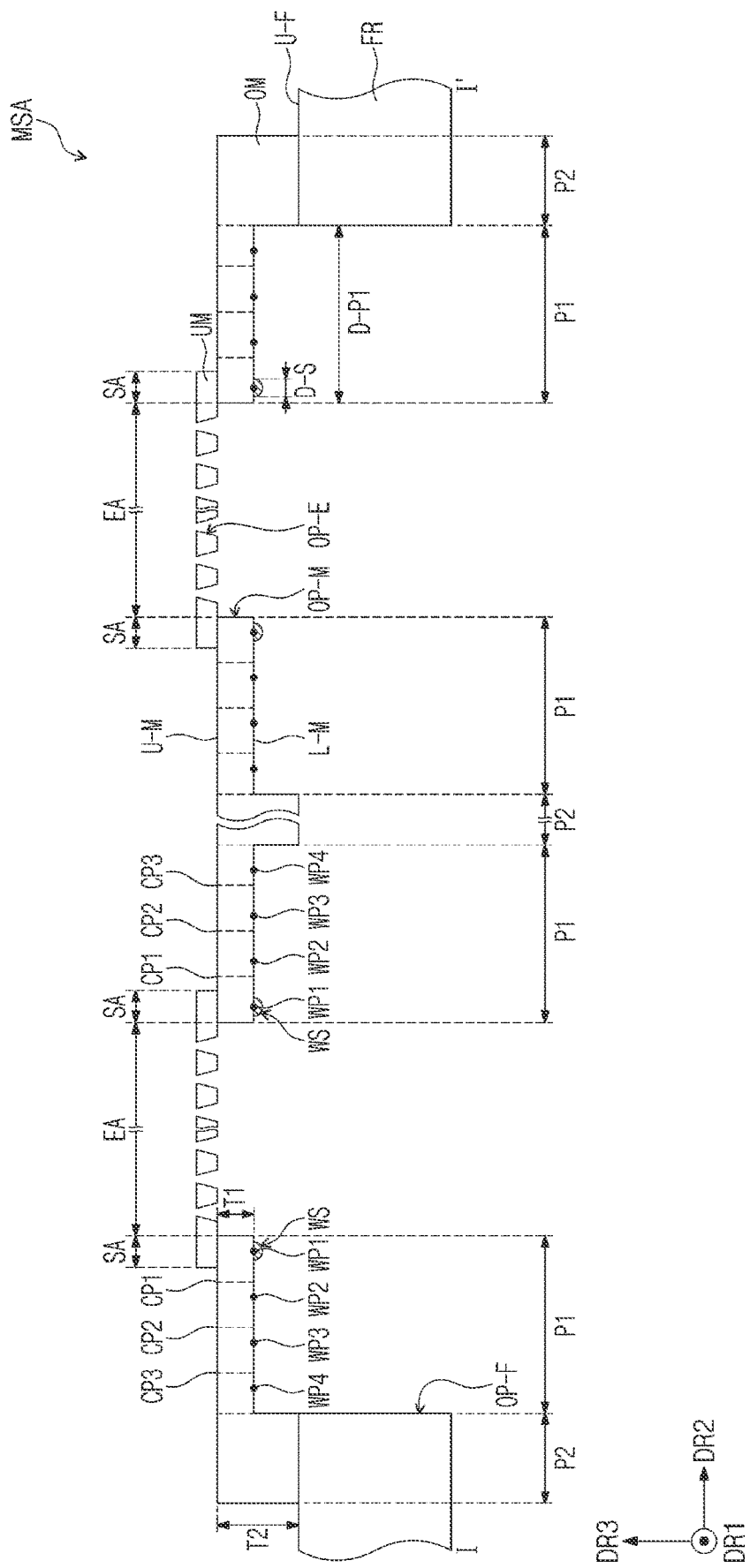
FIG. 4 is a schematic cross-sectional view taken along line I-I' of FIG. 2.

FIG. 2 is an exploded perspective view of the mask assembly MSA according to an embodiment of the disclosure. FIG. 3A is a plan view of the open mask OM according to an embodiment of the disclosure. FIG. 3B is an enlarged plan view of area PP' of FIG. 3A. FIG. 4 is a schematic cross-sectional view taken along line I-I' of FIG. 2.

Referring to FIG. 2, the mask assembly MSA may include the frame FR, the open mask OM, and the unit mask UM.

The frame FR may be disposed under the open mask OM and the unit mask UM and may support the open mask OM and the unit mask UM.

According to an embodiment, the frame FR may include sticks (or, e.g., an elongated structure) extending in the first direction DR1 and sticks extending in the second direction DR2. The sticks extending in the second direction DR2 may extend from both ends of the sticks extending in the first direction DR1, respectively. The sticks extending in the first and second directions DR1 and DR2 may be connected to each other to define a frame opening OP-F.

The deposition material EM (refer to FIG. 1) sprayed by the deposition source DS (refer to FIG. 1) may pass through openings defined by the open mask OM and the unit mask UM after passing the frame opening OP-F.

In the embodiment, one frame opening OP-F is defined through the frame FR as an embodiment, but the embodiment is not limited thereto. For example, multiple frame openings OP-F may be defined by the frame FR, and this will be described in detail later with reference to FIGS. 9 to 10B. One open mask OM may be supported by multiple frames FR.

The shape of the frame FR should not be particularly limited as long as the frame FR may support the open mask OM. The frame FR may be fixed to the sidewalls of the deposition chamber CB (refer to FIG. 1), but it should not be particularly limited.

The frame FR may include a metal material. The frame FR may include, for example, stainless steel (SUS), Invar, nickel (Ni), an alloy of nickel and cobalt, an alloy of nickel and iron, or the like.

The open mask OM may be disposed on the frame FR. The open mask OM may include a lower surface L-M that is in contact with the frame FR and an upper surface U-M opposite to the lower surface L-M. The open mask OM may have a rectangular shape defined by long sides extending in the first direction DR1 and short sides extending in the second direction DR2 in a plan view.

The open mask OM may be provided with an opening OP-M defined therethrough by removing a portion of the open mask OM from the upper surface U-M to the lower surface L-M in the third direction DR3.

According to an embodiment, multiple openings OP-M may be defined on the open mask OM. The openings OP-M may be arranged in the first direction DR1 and the second direction DR2. FIG. 2 shows the openings OP-M arranged in five rows by three columns (5×3) as an embodiment, however, the number and the arrangement of the openings OP-M should not be limited thereto or thereby.

The openings OP-M may be disposed to overlap the frame opening OP-F. Accordingly, the deposition material EM (refer to FIG. 1) sprayed by the deposition source DS (refer to FIG. 1) may be provided to the openings OP-M through the frame opening OP-F without being interfered with the frame FR.

Inner side surfaces I-M of the open mask OM, which respectively define the openings OP-M, may include short sides extending in the first direction DR1 and long sides extending from the short sides in the second direction DR2. Each of the openings OP-M may have a rectangular shape or may have a quadrangular shape, and the corners where the long side meets the short side may have a rounded shape or a shape with a curvature.

The open mask OM may include a metal material. According to an embodiment, the open mask OM may include at least one of stainless steel (SUS), Invar, nickel (Ni), cobalt (Co), an alloy of nickel, and an alloy of nickel and cobalt.

The unit mask UM may be disposed on the open mask OM. For example, the unit mask UM may be disposed on the upper surface U-M of the open mask OM. According to an embodiment, the unit mask UM may be provided in plural. The unit masks UM may be disposed to correspond to the openings OP-M. For example, each of the unit masks UM may be disposed to overlap a corresponding opening among the openings OP-M.

Accordingly, the unit masks UM may be arranged in the first direction DR1 and the second direction DR2. In FIG. 2, the unit masks UM are arranged in five rows by three columns (5×3), however, the number and the arrangement of the unit masks UM should not be particularly limited.

Each of the unit masks UM may include a metal material. According to an embodiment, each of the unit masks UM may include at least one of stainless steel (SUS), Invar, nickel (Ni), cobalt (Co), an alloy of nickel, and an alloy of nickel and cobalt.

According to the embodiment, each of the unit masks UM may include deposition openings OP-E. The deposition openings OP-E may be exposed through the opening OP-M without being covered by the open mask OM. Accordingly, the deposition material EM (refer to FIG. 1) sprayed by the deposition source DS (refer to FIG. 1) may be provided to the deposition openings OP-E through the opening OP-M without being interfered with the open mask (OM), and the deposition material EM may be deposited on the base substrate BS (refer to FIG. 1) to form a deposition pattern corresponding to the deposition openings OP-E.

FIG. 3A is a plan view of the open mask OM viewed from the lower surface L-M of the open mask OM. Referring to FIG. 3A, the open mask OM may include first portions P1 and a second portion P2. In the disclosure, for the convenience of explanation, the first portions P1 and the second portion P2 are defined by dividing an area of the open mask OM, but the first portions P1 and the second portion P2 may substantially constitute one configuration.

The openings OP-M of the open mask OM may be defined by the first portions P1. For example, the inner side surface I-M (refer to FIG. 2) defining one opening OP-M may correspond to an inner side surface of one first portion P1.

The first portions P1 may be portions where the open mask OM and the unit mask UM (refer to FIG. 2) are welded with each other in a manufacturing process of the mask assembly MSA (refer to FIG. 2). The first portions P1 may be portions to which a cutting process is applied in a repairing process of the mask assembly MSA.

The second portion P2 may surround the first portions P1. In the embodiment, the second portion P2 may be a portion on which the welding process is not performed in the manufacturing of the mask assembly MSA (refer to FIG. 2) and to which the cutting process is not applied in the repairing of the mask assembly MSA.

FIG. 3B is an enlarged plan view of one first portion among the first portions P1 of the open mask OM (refer to FIG. 3A). Referring to FIG. 3B, the first portion P1 may include a welding portion WP and a cutting portion CP. In the embodiment, the welding portion WP may be defined as the portion on which the welding process is applied, and the cutting portion CP may be defined as the portion to which the cutting process is applied.

The welding portion WP may include a first welding portion WP1, a second welding portion WP2, a third welding portion WP3, and a fourth welding portion WP4. The first, second, third, and fourth welding portions WP1, WP2, WP3, and WP4 may be sequentially arranged in a direction away from the opening OP-M.

Each of the first, second, third, and fourth welding portions WP1, WP2, WP3, and WP4 may be provided as multiple spots. The spots of the first welding portion WP1 may be arranged along the inner side surface I-M (refer to FIG. 2) defining each of the openings OP-M of the open mask OM.

For example, the spots of the first welding portion WP1 may surround a corresponding opening among the openings OP-M and may be arranged in the first and second directions DR1 and DR2. The spots of the second welding portion WP2 may surround the spots of the first welding portion WP1 and may be arranged in the first and second directions DR1 and DR2. The spots of the third welding portion WP3 may surround the spots of the second welding portion WP2 and may be arranged in the first and second directions DR1 and DR2. The spots of the fourth welding portion WP4 may surround the spots of the third welding portion WP3 and may be arranged in the first and second directions DR1 and DR2.

Each of the first, second, third, and fourth welding portions WP1, WP2, WP3, and WP4 of FIG. 3B is illustrated in a dot shape, however, it should not be limited thereto or thereby. According to an embodiment, at least one of the first, second, third, and fourth welding portions WP1, WP2, WP3, and WP4 may be provided as a line shape.

The cutting portion CP may include a first cutting portion CP1, a second cutting portion CP2, and a third cutting portion CP3. The first, second, and third cutting portions CP1, CP2, and CP3 may be sequentially arranged in a direction away from the opening OP-M.

Each of the first, second, and third cutting portions CP1, CP2, and CP3 may be disposed between two corresponding welding portions among the first, second, third, and fourth welding portions WP1, WP2, WP3, and WP4 in a plan view and may surround the first, second, and third welding portions WP1, WP2, and WP3, respectively. Each of the first, second, and third cutting portions CP1, CP2, and CP3 may have a rectangular line shape defined by long sides extending in the second direction DR2 and short sides extending in the first direction DR1 in a plan view.

For example, the first cutting portion CP1 may be disposed between the first welding portion WP1 and the second welding portion WP2 and may surround the spots of the first welding portion WP1. The second cutting portion CP2 may be disposed between the second welding portions WP2 and the third welding portions WP3 and may surround the spots of the second welding portion WP2. The third cutting portion CP3 may be disposed between the third welding portions WP3 and the fourth welding portions WP4 and may surround the spots of the third welding portion WP3.

Accordingly, the first welding portion WP1, the first cutting portion CP1, the second welding portion WP2, the second cutting portion CP2, the third welding portion WP3, the third cutting portion CP3, and the fourth welding portion WP4 may be sequentially arranged in a direction toward the second portion P2 from the opening OP-M.

FIG. 3B shows four groups of the welding portions WP1, WP2, WP3, and WP4 and three cutting portions CP1, CP2, and CP3, however, this is merely an example, and the number of the welding portions WP and the number of the cutting portions CP should not be particularly limited.

Referring to FIG. 4, the mask assembly MSA may include the frame FR through which the frame opening OP-F is defined, the open mask OM disposed on an upper surface U-F of the frame FR, and the unit mask UM disposed on the upper surface U-M of the open mask OM. FIG. 4 shows the mask assembly MSA before the repairing process. In FIG. 4, the same/similar reference numerals denote the same/similar elements in FIGS. 1 to 3B, and thus, detailed descriptions of the same/similar elements will be omitted.

According to an embodiment, the first portion P1 of the open mask OM may be disposed to overlap the frame opening OP-F. FIG. 4 shows a structure in which the entire portion of the first portion P1 overlaps the frame opening OP-F, however, according to an embodiment, a portion of the first portion P1 may be disposed to overlap the frame FR as long as the structure does not interfere with the welding process performed on the welding portion WP in the manufacturing of the mask assembly MSA and does not interfere with the process of cutting the first portion P1 along the cutting portion CP in the repairing of the mask assembly MSA.

Welding protrusions WS may be formed on the first, second, third, and fourth welding portions WP1, WP2, WP3, and WP4. FIG. 4 shows the mask assembly MSA before the repairing process, for example, the cutting process on the open mask OM is not applied. The coupling between the open mask OM to which the cutting process is not applied and the unit mask UM may proceed by welding the first welding portion WP1 closest to the opening OP-M among the first, second, third, and fourth welding portions WP1, WP2, WP3, and WP4. Accordingly, the welding protrusions WS may be formed along the first welding portion WP1.

According to the disclosure, in case of coupling the open mask OM with the unit mask UM in the manufacturing of the mask assembly MSA, the welding process may be performed on the lower surface L-M of the open mask OM, and thus, the welding protrusions WS may be formed on the lower surface L-M. Accordingly, the reduction in adhesion between the unit mask UM and the base substrate BS (refer to FIG. 1), which is caused by the welding protrusions WS, may be reduced.

According to the disclosure, foreign substances generated during the welding process may be also accumulated on the lower surface L-M of the open mask OM, and thus, the reduction in adhesion between the unit mask UM and the base substrate BS due to the foreign substances may be reduced.

Accordingly, it is possible to reduce an occurrence of a shadow phenomenon where an additional material is deposited on the base substrate BS in addition to the deposition pattern. Therefore, a deposition reliability of the mask assembly MSA may be improved.

The unit mask UM may include a deposition area EA in which the deposition openings OP-E are defined and a peripheral area SA surrounding the deposition area EA. In the embodiment, the peripheral area SA may be covered by the open mask OM viewed from the lower surface L-M of the open mask OM. Thus, the deposition area EA may overlap the opening OP-M.

The peripheral area SA may be defined to overlap the first welding portion WP1 of the open mask OM. According to the disclosure, the closer the first welding portion WP1 is to the opening OP-M, and the shorter the peripheral area while maintaining the coupling with the open mask OM and overlapping the first welding portion WP1, the number of possible replacements of the unit mask UM may increase in the repairing of the mask assembly MSA.

An end of the peripheral area SA may be disposed at a position spaced apart from the first cutting portion CP1 in a direction toward the opening OP-M. For example, the first cutting portion CP1 may be provided to be located outside of the end of the peripheral area SA. In other words, the first cutting portion CP1 may be disposed closer to the second portion P2 than the end of the peripheral area SA.

Accordingly, in case that the open mask OM is cut along the first cutting portion CP1 in the repairing of the mask assembly MSA, the unit mask UM may be separated from the mask assembly MSA with a portion of the first portion P1. Thus, a defective unit mask may be removed and may be replaced with a new (or other undamaged) unit mask (hereinafter referred to as a new unit mask).

Unlike the disclosure, in a case where the unit mask UM is separated from the mask assembly MSA by detaching only the unit mask UM, the open mask OM may be damaged by a force that detaches the unit mask. However, according to the disclosure, the unit mask UM may be removed by cutting the open mask OM without detaching the unit mask UM, and thus, the damage on the open mask OM may be reduced. Accordingly, a deposition yield and a deposition reliability of the mask assembly MSA may be improved.

According to the disclosure, the first portion P1 of the open mask OM may have a thickness T1 smaller than a thickness T2 of the second portion P2 of the open mask OM. Therefore, the first portion P1 may be readily cut in the repairing of the mask assembly MSA.

According to an embodiment, the thickness T1 of the first portion P1 may be equal to or smaller than about 100 micrometers. In case that the thickness T1 of the first portion P1 is greater than about 100 micrometers, the open mask OM may not be readily cut. The thickness T1 of the first portion P1 may be equal to or greater than about 10 micrometers and equal to or smaller than about 50 micrometers.

Each of the welding protrusions WS may have a length D-S equal to or greater than about 100 micrometers and equal to or smaller than about 500 micrometers in the second direction DR2 in a cross-section view, and the first portion P1 may have a length D-P1 greater than the length D-S of each of the welding protrusions WS in the cross-section. As the length D-P1 of the first portion P1 in the cross-section increases, the number of the possible cutting processes may increase, and thus, the number of possible replacements of the unit mask UM may increase.

According to an embodiment, the length D-P1 of the first portion P1 in the cross-section may be equal to or greater than about 300 micrometers and equal to or smaller than about 2 millimeters. In case that the length D-P1 of the first portion P1 in the cross-section is smaller than about 300 micrometers, it is insufficient to cut the first portion P1 to separate the unit mask UM. In case that the length D-P1 of the first portion P1 in the cross-section is greater than about 2 millimeters, the unit mask UM may be sagged due to an insufficient strength of the first portion P1 to support the unit mask UM.

As the mask assembly MSA shown in FIG. 4 includes the first, second, and third cutting portions CP1, CP2, and CP3, it is possible to perform three repairing processes, i.e., three times of replacements of the unit mask UM, through three cutting processes of the first portion P1. Accordingly, the mask assembly MSA may employ four new unit masks UM. The mask assembly MSA may include the first, second, third, and fourth welding portions WP1, WP2, WP3, and WP4, and thus, the four new unit masks UM may be coupled with the open mask OM.

However, the number of cutting processes applied to the open mask OM is merely an example, and the number of cutting processes applied to the open mask OM may be determined depending on the length D-P1 of the first portion P1, the length D-S of the welding protrusions WS, and the length of the unit mask UM, particularly, the length of the peripheral area SA. For example, the number of cutting processes applied to the open mask OM may be greater or smaller than three times.

Figure 5A:
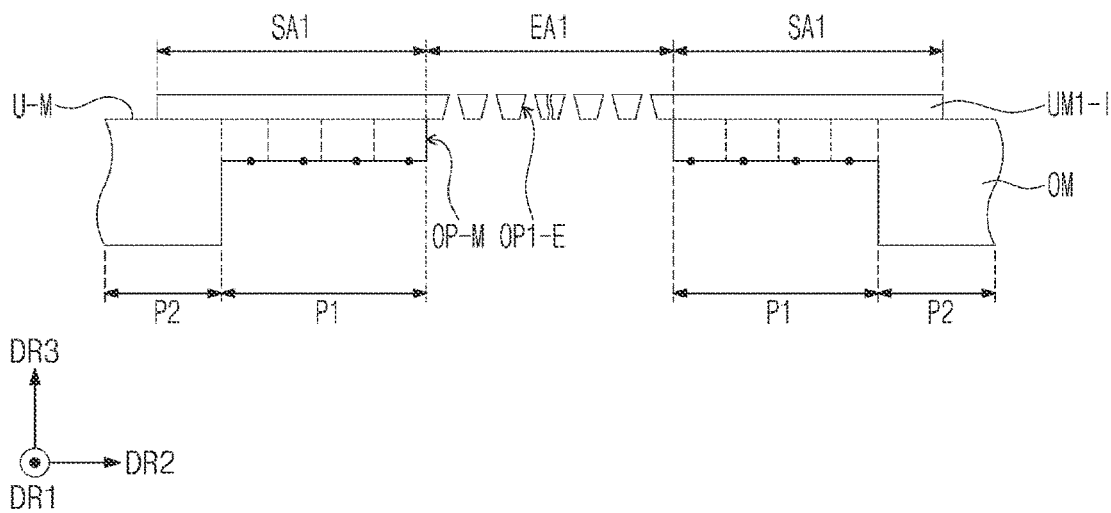
FIG. 5A is a schematic cross-sectional view of a method of manufacturing a mask assembly according to an embodiment of the disclosure.
Figure 5B:
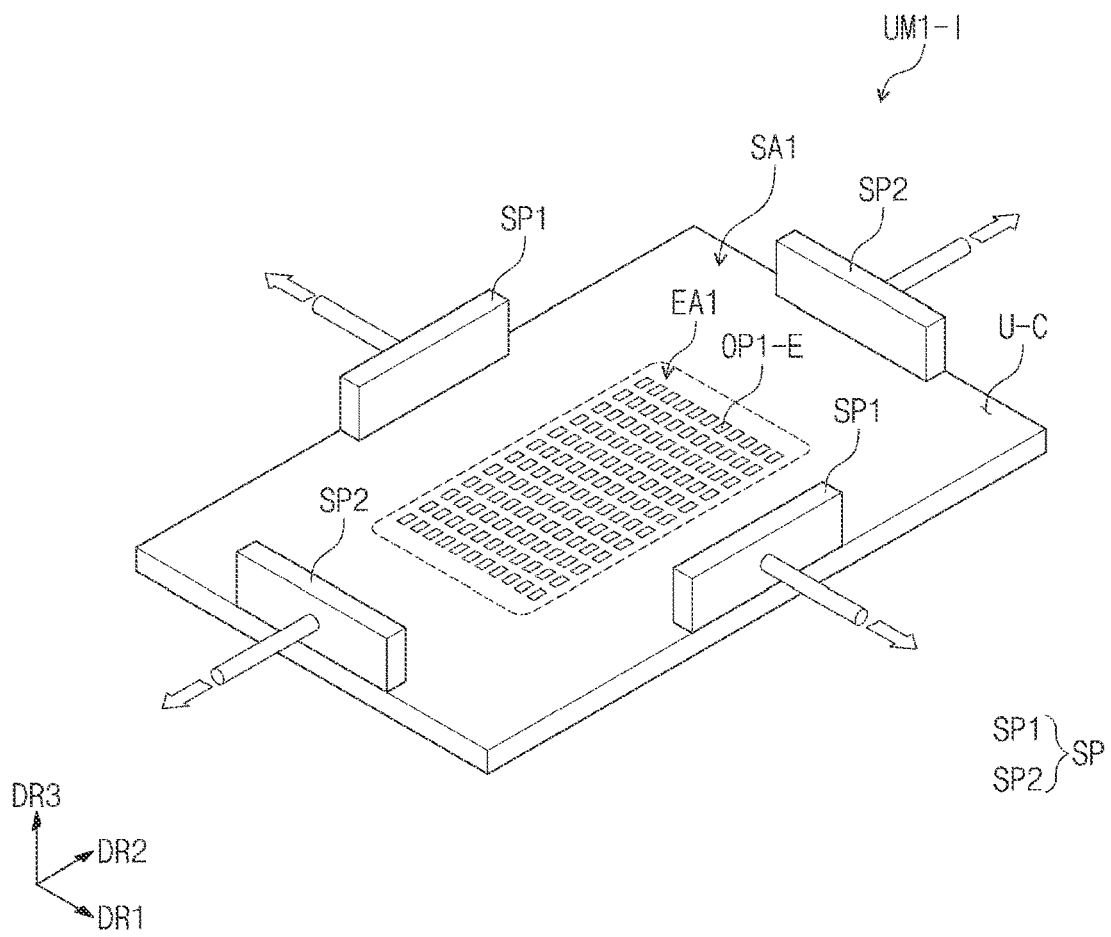
FIG. 5B is a perspective view of a method of manufacturing a mask assembly according to an embodiment of the disclosure.
Figure 5C:
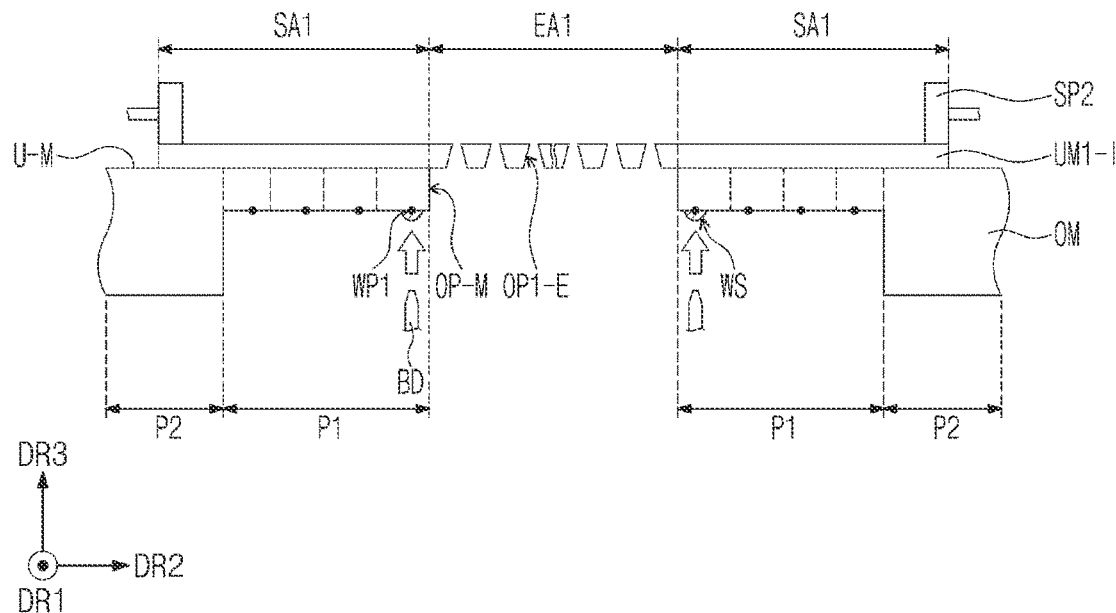
FIGS. 5C to 5E are schematic cross-sectional views of a method of manufacturing a mask assembly according to an embodiment of the disclosure.
Figure 5D:
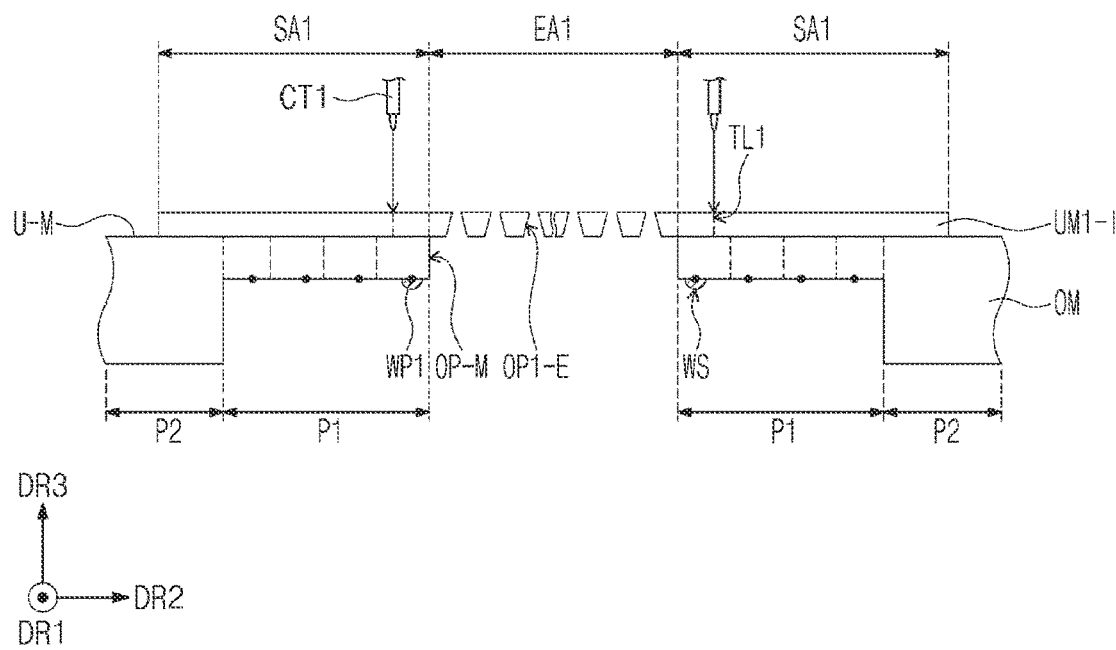
Figure 5E:
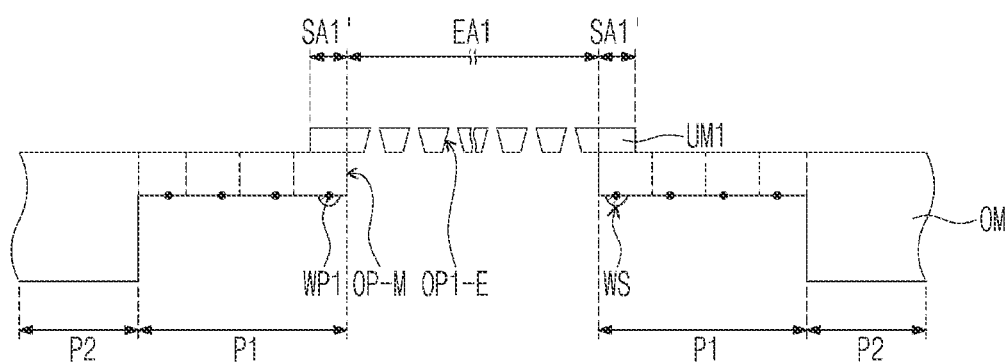
Figure 5E:
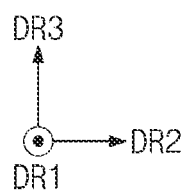
Figure 6:
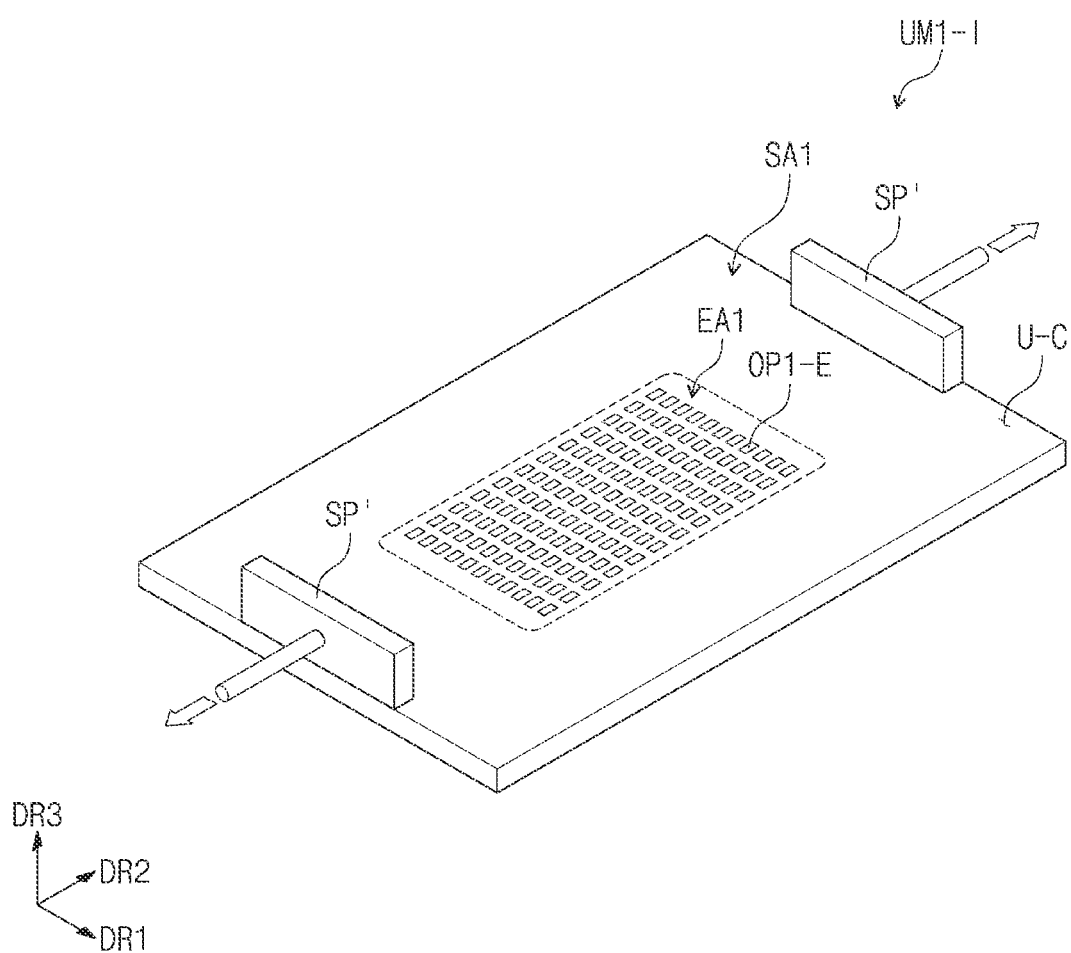
FIG. 6 is a perspective view of a method of manufacturing a mask assembly according to an embodiment of the disclosure.

FIG. 5A is a schematic cross-sectional view of a method of manufacturing the mask assembly MSA according to an embodiment of the disclosure. FIG. 5B is a perspective view of a method of manufacturing the mask assembly MSA according to an embodiment of the disclosure. FIGS. 5C to 5E are schematic cross-sectional views of a method of manufacturing the mask assembly MSA according to an embodiment of the disclosure. FIG. 6 is a perspective view of a method of manufacturing a mask assembly MSA according to an embodiment of the disclosure. FIGS. 5A and 5C to 5E show a portion of the open mask OM and one unit mask UM of the mask assembly MSA (refer to FIG. 2), and the frame FR is omitted. In FIGS. 5A to 5E and 6, the same/similar reference numerals denote the same/similar elements in FIGS. 1 to 4, and thus, detailed descriptions of the same/similar elements will be omitted.

Referring to FIG. 5A, the manufacturing method of the mask assembly MSA (refer to FIG. 2) may include disposing a first preliminary unit mask UM1-I on the open mask OM.

The first preliminary unit mask UM1-I may include a first deposition area EA1 and a first peripheral area SA1 surrounding the first deposition area EA1. The first deposition area EA1 may include first deposition openings OP1-E. The first preliminary unit mask UM1-I may be disposed such that the first deposition openings OP1-E overlap the opening OP-M.

According to an embodiment, the first peripheral area SA1 of the first preliminary unit mask UM1-I may overlap the entire area of the first portion P1 and a portion of the second portion P2, however, it should not be limited thereto or thereby. According to an embodiment, the first peripheral area SA1 may not overlap the second portion P2.

According to an embodiment, the open mask OM and the first preliminary unit mask UM1-I may be disposed in an upright state to extend in the third direction DR3. An upper surface of the first preliminary unit mask UM1-I may be in contact with a porous chuck (not shown). The porous chuck may be, but not limited to, a vacuum chuck. The first preliminary unit mask UM1-I may be moved by the porous chuck and may be in contact with the upper surface U-M of the open mask OM.

However, the process of disposing the first preliminary unit mask UM1-I should not be limited thereto or thereby, and as shown in FIG. 5A, the first preliminary unit mask UM1-I may be horizontally disposed while the open mask OM is in a horizontal state.

Referring to FIGS. 5B and 5C, the manufacturing method of the mask assembly MSA (refer to FIG. 2) may include coupling the open mask OM to the first preliminary unit mask UM1-I. According to an embodiment, the open mask OM may be coupled to the first preliminary unit mask UM1-I in a state where a tensile force is applied to the first preliminary unit mask UM1-I.

As shown in FIG. 5B, the tensile force may be applied to the first preliminary unit mask UM1-I.

According to an embodiment, support portions SP may be disposed on the upper surface U-C of the first preliminary unit mask UM1-I. The support portions SP may be disposed adjacent to ends of the first preliminary unit mask UM1-I.

The support portions SP may include first support portions SP1 and second support portions SP2. The first support portions SP1 may be disposed respectively adjacent to long sides of the first preliminary unit mask UM1-I, which extend in the second direction DR2, and the second support portions SP2 may be disposed respectively adjacent to short sides of the first preliminary unit mask UM1-I, which extend in the first direction DR1.

The first support portions SP1 may apply the tensile force to the first preliminary unit mask UM1-I in the first direction DR1 and a direction opposite to the first direction DR1, respectively. The second support portions SP2 may apply the tensile force to the first preliminary unit mask UM1-I in the second direction DR2 and a direction opposite to the second direction DR2, respectively.

The support portions SP may be implemented in various ways as along as the support portions SP fix the end of the first preliminary unit mask UM1-I and may apply the tensile force. For example, the support portions SP may be, but not limited to, the porous chuck described with reference to FIG. 5A or a device such as a clamp.

As shown in FIG. 5C, the first preliminary unit mask UM1-I may be coupled to the open mask OM using a bonding machine BD. The bonding machine BD may be a welding device or a laser oscillator. The bonding machine BD may provide a heat beam or a laser beam onto the first welding portion WP1. A portion of the open mask OM may be melted, and thus, the open mask OM may be coupled to the first preliminary unit mask UM1-I.

After the welding process is performed on the first welding portion WP1, the welding protrusions WS may be formed on the first welding portion WP1.

Referring to FIGS. 5D and 5E, the manufacturing method of the mask assembly MSA (refer to FIG. 2) may include forming a first unit mask UM1 from the first preliminary unit mask UM1-I. A portion of the first preliminary unit mask UM1-I in the first peripheral area SA1 may be cut, and thus, the first unit mask UM1 having a size smaller than that of the first preliminary unit mask UM1-I in a plan view may be formed.

In detail, the portion of the first preliminary unit mask UM1-I may be removed along the end of the first preliminary unit mask UM1-I in the first peripheral area SA1 such that an end of the first unit mask UM1 may be disposed more adjacent to the welding protrusions WS than the first preliminary unit mask UM1-I.

As shown in FIG. 5D, the first preliminary unit mask UM1-I may be cut using a first cutter CT1. In the embodiment, the first cutter CT1 may irradiate a beam along a first trimming line TL1 to cut the first preliminary unit mask UM1-I. The first trimming line TL1 may be defined between a portion overlapping the welding protrusion WS and a boundary of the first portion P1 and the second portion P2 and may be a closed line surrounding the first deposition area EA1 in a plan view.

The first cutter CT1 may include various devices as along as the first cutter CT1 provides the beam to the first preliminary unit mask UM1-I to remove the portion of the first peripheral area SA1. For example, the first cutter CT1 may include a heat irradiator, a light irradiator, a laser oscillator, or the like.

As shown in FIG. 5E, the first preliminary unit mask UM1-I may be cut, and may be formed as the first unit mask UM1 with new ends. For example, the first unit mask UM1 may include a first peripheral area SA1' having a size smaller than that of the first peripheral area SA1 of the first preliminary unit mask UM1-I in a plan view and having a length smaller than that of the first peripheral area SA1 of the first preliminary unit mask UM1-I in a cross-section view. The open mask OM and the first unit mask UM1 shown in FIG. 5E may respectively correspond to the open mask OM and the unit mask UM described with reference to FIG. 4.

FIG. 6 is a perspective view of the manufacturing method of the mask assembly MSA according to an embodiment of the disclosure. FIG. 6 shows a process of applying a tensile force to a first preliminary unit mask UM1-I in a process of coupling an open mask OM to the first preliminary unit mask UM1-I.

According to an embodiment, support portions SP' may be disposed on an upper surface U-C of the first preliminary unit mask UM1-I, and the support portions SP' may be disposed adjacent to short sides of the first preliminary unit mask UM1-I extending in the first direction DR1, respectively. In the embodiment, the support portions SP' may apply the tensile force to the first preliminary unit mask UM1-I in the second direction DR2 and the direction opposite to the second direction DR2.

However, the direction in which the first preliminary unit mask UM1-I is tensioned should not be limited thereto or thereby. For example, the support portions SP' may be disposed adjacent to long sides of the first preliminary unit mask UM1-I extending in the second direction DR2, respectively, and the support portions SP' may apply the tensile force to the first preliminary unit mask UM1-I in the first direction DR1 and the direction opposite to the first direction DR1.

FIGS. 7A to 7F are schematic cross-sectional views of a method of repairing the mask assembly according to an embodiment of the disclosure. FIG. 8 is a schematic cross-sectional view of a method of repairing the mask assembly according to an embodiment of the disclosure. FIGS. 7A to 7F show a portion of the open mask OM of the mask assembly MSA (refer to FIG. 2) and one unit mask UM (refer to FIG. 2), and the frame FR is omitted.

FIGS. 7A to 7F show the repairing method of the mask assembly MSA to replace a damaged unit mask with a new unit mask.

The repairing method of the mask assembly MSA may include a process of replacing the damaged unit mask with the new unit mask in a case where a portion of the unit mask UM is damaged during the deposition process on the base substrate BS using the deposition apparatus EDA and a deposition quality is deteriorated. Hereinafter, in FIGS. 7A to 7F, the same/similar reference numerals denote the same/similar elements in FIGS. 1 to 6, and thus, detailed descriptions of the same/similar elements will be omitted.

Figure 7A:
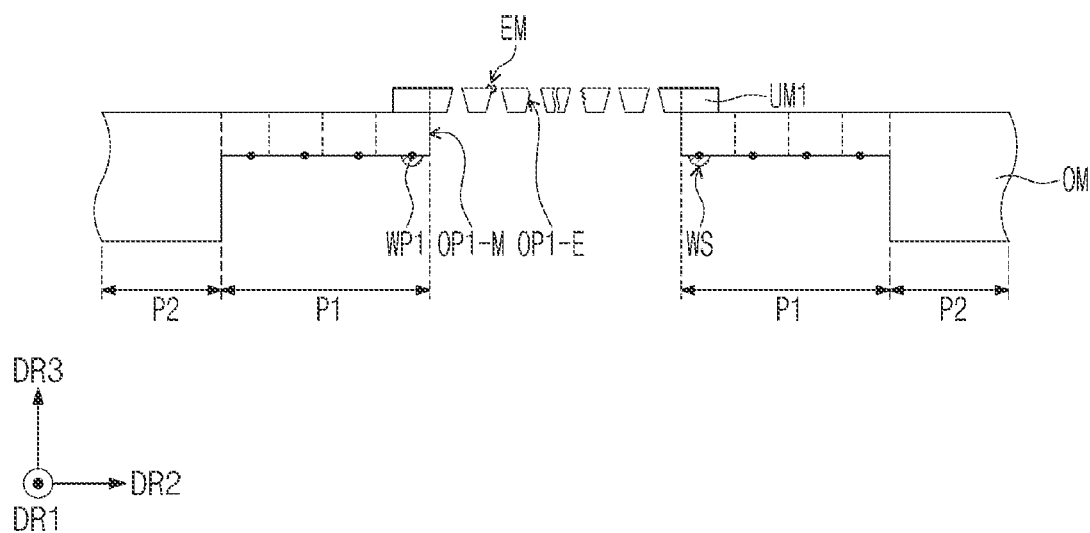
FIGS. 7A to 7F are schematic cross-sectional views of a method of repairing a mask assembly according to an embodiment of the disclosure.
Figure 8:
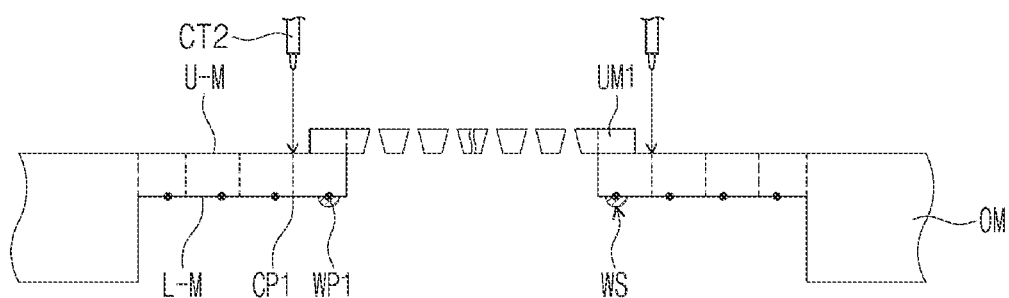
FIG. 8 is a schematic cross-sectional view of a method of repairing a mask assembly according to an embodiment of the disclosure.
Figure 8:
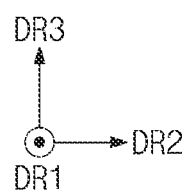

Referring to FIG. 7A, the repairing method of the mask assembly MSA (refer to FIG. 2) may include providing the mask assembly MSA including the first unit mask UM1.

The mask assembly MSA may include the open mask OM and the first unit mask UM1. The open mask OM may be provided with a first opening OP1-M defined therethrough. The first deposition openings OP1-E may be defined through the first unit mask UM1. The first deposition openings OP1-E may overlap the first opening OP1-M.

The open mask OM and the first unit mask UM1 shown in FIG. 7A may correspond to the open mask OM and the first unit mask UM1 described with reference to FIG. 5E, respectively. Accordingly, the first opening OP1-M shown in FIG. 7A may correspond to the opening OP-M described with reference to FIG. 5E.

The first unit mask UM1 shown in FIG. 7A may be provided in a damaged state after the deposition process is performed through the deposition apparatus EDA.

The damage on the first unit mask UM1 may mean that the upper surface, the lower surface, or a portion of the inner side surface defining the first deposition openings OP1-E is damaged. The damage on the first unit mask UM1 may also mean that some of the first deposition openings OP1-E are blocked by the deposition material EM accumulated in some of the first deposition openings OP1-E.

Figure 7B:
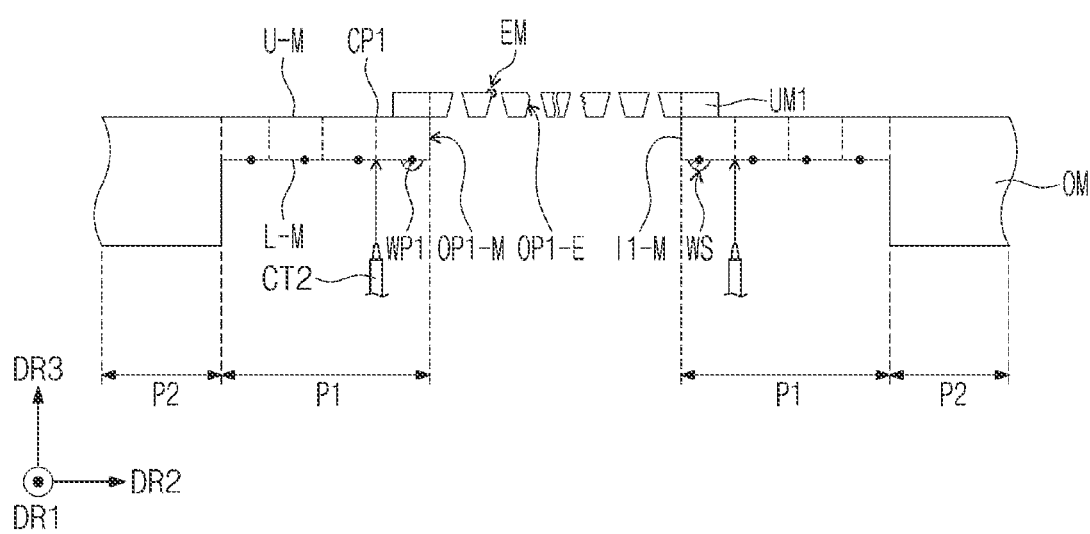
Figure 7C:
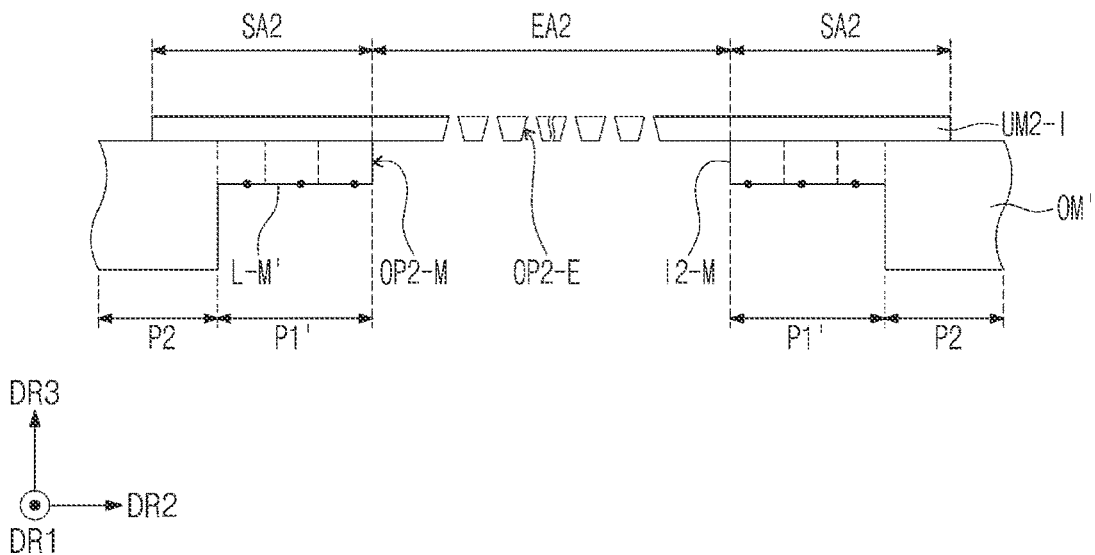

Referring to FIGS. 7B and 7C, the repairing method of the mask assembly MSA (refer to FIG. 2) may include first cutting the open mask OM.

As shown in FIG. 7B, the open mask OM may be cut using a second cutter CT2. The second cutter CT2 may irradiate a beam along the first cutting portion CP1 to cut the open mask OM. The first cutting portion CP1 may be disposed outside of the end of the first unit mask UM1 in the first portion P1. Accordingly, the portion of the first portion P1 of the open mask OM, which includes the welding protrusions WS, may be separated from the mask assembly MSA (refer to FIG. 2). Accordingly, the defective first unit mask UM1 may be separated from the mask assembly MSA.

According to an embodiment, the second cutter CT2 may be disposed under the lower surface L-M of the open mask OM. Accordingly, the second cutter CT2 may cut the open mask OM from the lower surface L-M to the upper surface U-M along the first cutting portion CP1.

The second cutter CT2 may be implemented in various embodiments as long as the second cutter CT2 may provide the beam onto the open mask OM to cut the portion of the first portion P1. For example, the second cutter CT2 may include a laser oscillator and may cut the open mask OM using a laser cutting process.

In case that an end portion of the first portion P1 is removed along an inner side surface I1-M of the first portion P1, which defines the first opening OP1-M, a first portion P1' including a new inner side surface I2-M may be formed as shown in FIG. 7C. The inner side surface I2-M of the first portion P1' may define a second opening OP2-M. The second opening OP2-M may have a size greater than a size of the first opening OP1-M in a plan view.

Figure 7D:
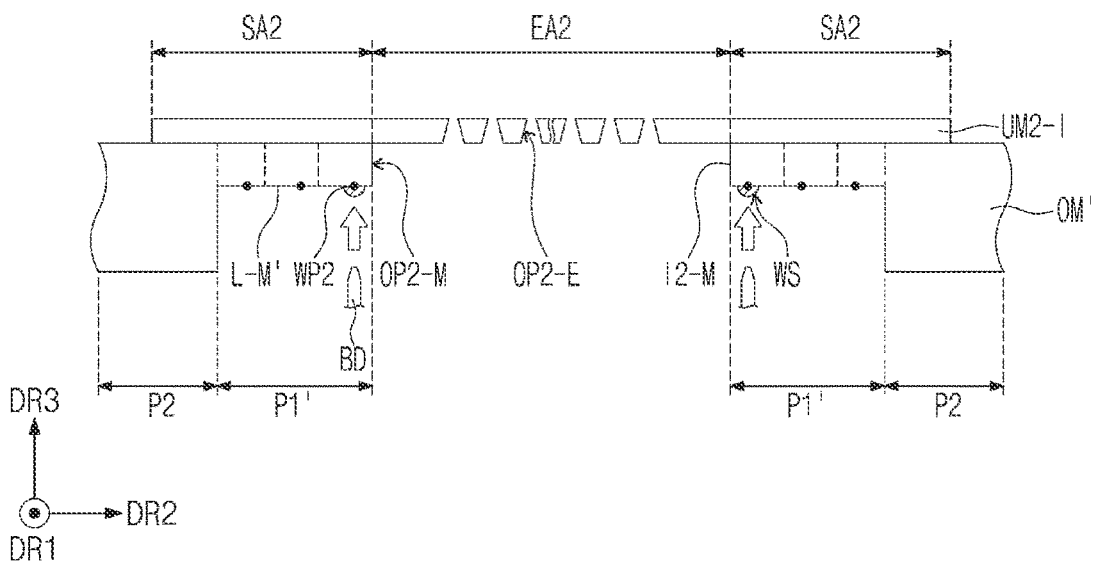
Figure 7E:
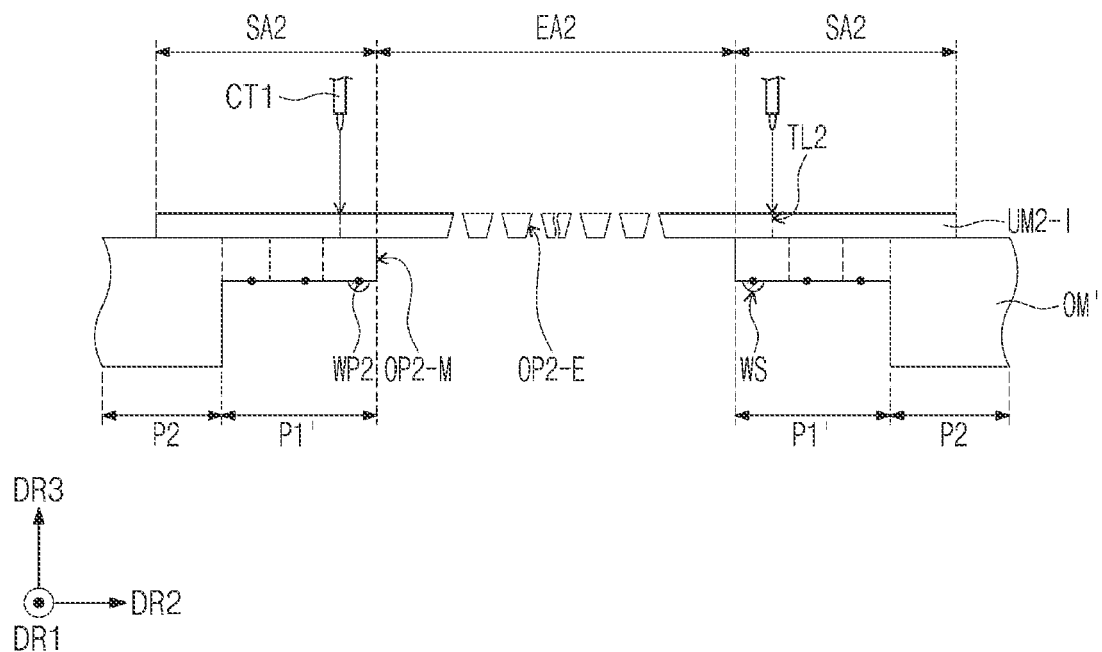

Referring to FIGS. 7C to 7E, the repairing method of the mask assembly MSA (refer to FIG. 2) may include coupling a second unit mask UM2 (refer to FIG. 7F) to a first cut open mask OM' (hereinafter, referred to as a repaired open mask).

Referring to FIG. 7C, the coupling of the second unit mask UM2 (refer to FIG. 7F) to the repaired open mask OM' may include disposing a second preliminary unit mask UM2-I on the repaired open mask OM'.

The second preliminary unit mask UM2-I may include a second deposition area EA2 and a second peripheral area SA2. The second deposition area EA2 may include second deposition openings OP2-E. The second deposition openings OP2-E may correspond to the first deposition openings OP1-E (refer to FIG. 5A) of the first preliminary unit mask UM1-I (refer to FIG. 5A). The second preliminary unit mask UM2-I may be disposed such that all the second deposition openings OP2-E overlaps the second opening OP2-M.

The second peripheral area SA2 may be covered by the repaired open mask OM' viewed from a lower surface L-M' of the repaired open mask OM'.

According to an embodiment, the second preliminary unit mask UM2-I may have substantially the same shape as that of the first preliminary unit mask UM1-I (refer to FIG. 5A). For example, a length in the second direction DR2 in a cross-section view of the second preliminary unit mask UM2-I may be equal to a length in the second direction DR2 in a cross-section view of the first preliminary unit mask UM1-I.

The repaired open mask OM' may include the second opening OP2-M having the size greater than the size of the first opening OP1-M (refer to FIG. 7A) of the open mask OM (refer to FIG. 7A) that is not repaired, and thus, a size of an exposed portion of the second preliminary unit mask UM2-I may increase viewed from the lower surface L-M' of the repaired open mask OM'.

Referring to FIG. 7D, the coupling of the second unit mask UM2 (refer to FIG. 7F) to the open mask OM' may include coupling the repaired open mask OM' to the second preliminary unit mask UM2-I.

First, the tensile force may be applied to the second preliminary unit mask UM2-I. A method of tensioning the second preliminary unit mask UM2-I may be performed similarly to that described in FIG. 5B or FIG. 6.

For example, similar to the method described with reference to FIG. 5B, the second preliminary unit mask UM2-I may be tensioned in the first direction DR1, the direction opposite to the first direction DR1, the second direction DR2, and the direction opposite to the second direction DR2, or similar to the method described with reference to FIG. 6, the second preliminary unit mask UM2-I may be tensioned in the first direction DR1 and the direction opposite to the first direction DR1 or in the second direction DR2 and the direction opposite to the second direction DR2.

According to the embodiment, the repaired open mask OM' may be coupled to the second preliminary unit mask UM2-I using the bonding machine BD in the state where the tensile force is applied to the second preliminary unit mask UM2-I. The bonding machine BD may provide a heat beam or a laser beam onto the second welding portion WP2.

After the welding process is performed on the second welding portion WP2, the welding protrusions WS may be formed on the second welding portion WP2.

Figure 7F:
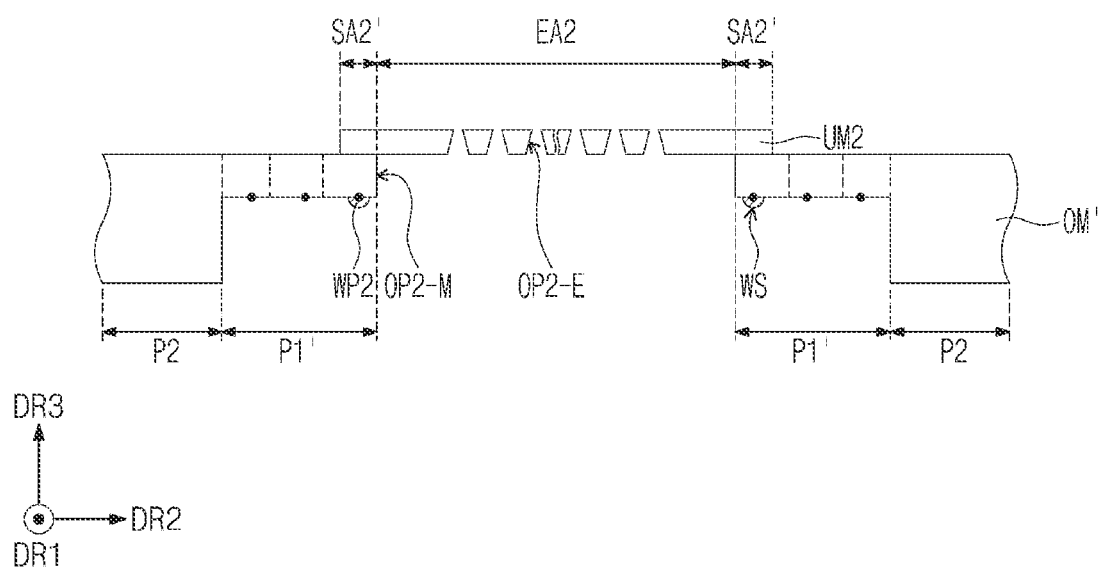

Referring to FIGS. 7E and 7F, the coupling of the second unit mask UM2 to the repaired open mask OM' may include forming the second unit mask UM2 from the second preliminary unit mask UM2-I. A portion of the second preliminary unit mask UM2-I may be cut in the second peripheral area SA2, and thus, the second unit mask UM2 may have the size smaller than the size of the second preliminary unit mask UM2-I in a plan view.

In detail, a portion of the second preliminary unit mask UM2-I may be removed in the second peripheral area SA2 along an end of the second preliminary unit mask UM2-1 such that an end of the second unit mask UM2 is more adjacent to the welding protrusions WS than the end of the second preliminary unit mask UM2-I is.

As shown in FIG. 7E, the second preliminary unit mask UM2-I may be cut using the first cutter CT1. In the embodiment, the first cutter CT1 may irradiate a beam along a second trimming line TL2 to cut the second preliminary unit mask UM2-I. The second trimming line TL2 may be defined between a portion overlapping the welding protrusion WS and a boundary of the first portion P1 and the second portion P2 and may be a closed line surrounding the second deposition area EA2 in a plan view.

As shown in FIG. 7F, the second preliminary unit mask UM2-I may be cut and may be formed as the second unit mask UM2 with new ends. For example, the second unit mask UM2 may include a second peripheral area SA2' having a size smaller than that of the second peripheral area SA2 of the second preliminary unit mask UM2-I in a plan view and having a length smaller than that of the second peripheral area SA2 of the second preliminary unit mask UM2-I in a cross-section view.

In case that defects occur in the second unit mask UM2, the defective second unit mask UM2 may be removed by second cutting the first portion P1 along the second cutting portion CP2 in the same manner as described in FIG. 7B.

The repaired open mask OM' may be coupled to a new unit mask UM through the welding process performed on the third welding portion WP3 in the same manner as described in FIGS. 7C to 7F. For example, the processes of FIGS. 7A to 7F may be repeatedly performed to correspond to the number of the welding portions WP (refer to FIG. 3B) and the number of the cutting portions CP (refer to FIG. 3B).

FIG. 8 is a schematic cross-sectional view showing the first cutting of the open mask OM of the repairing method of the mask assembly MSA (refer to FIG. 2).

According to an embodiment, the second cutter CT2 may be disposed above the upper surface U-M of the open mask OM. Accordingly, the second cutter CT2 may cut the open mask OM from the upper surface U-M to the lower surface L-M along the first cutting portion CP1.

Figure 9:
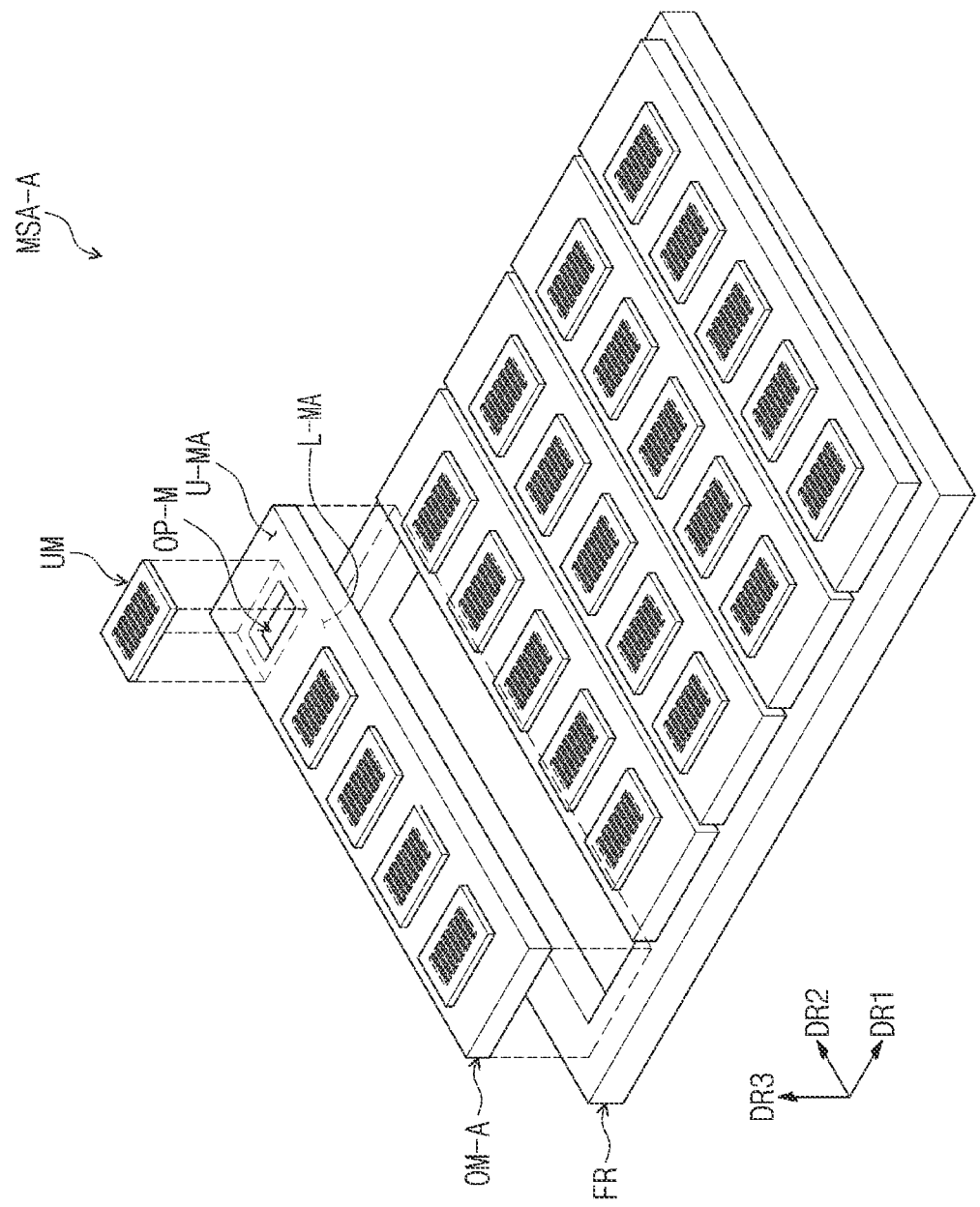
FIG. 9 is an exploded perspective view of a mask assembly according to an embodiment of the disclosure.
Figure 10A:
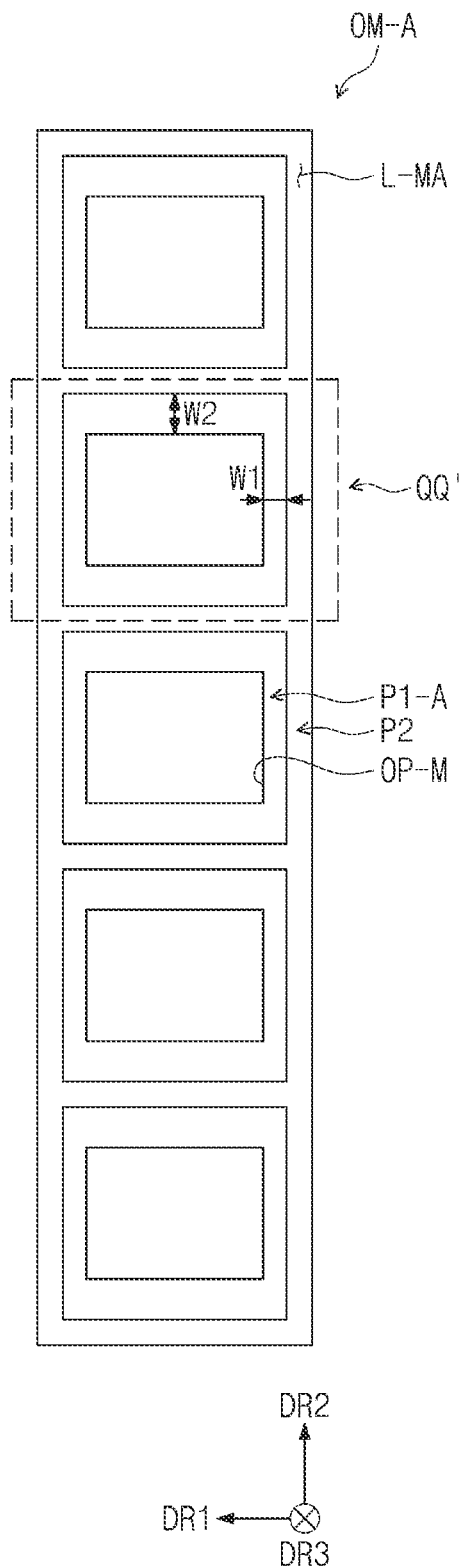
FIG. 10A is a plan view of an open mask according to an embodiment of the disclosure.
Figure 10B:
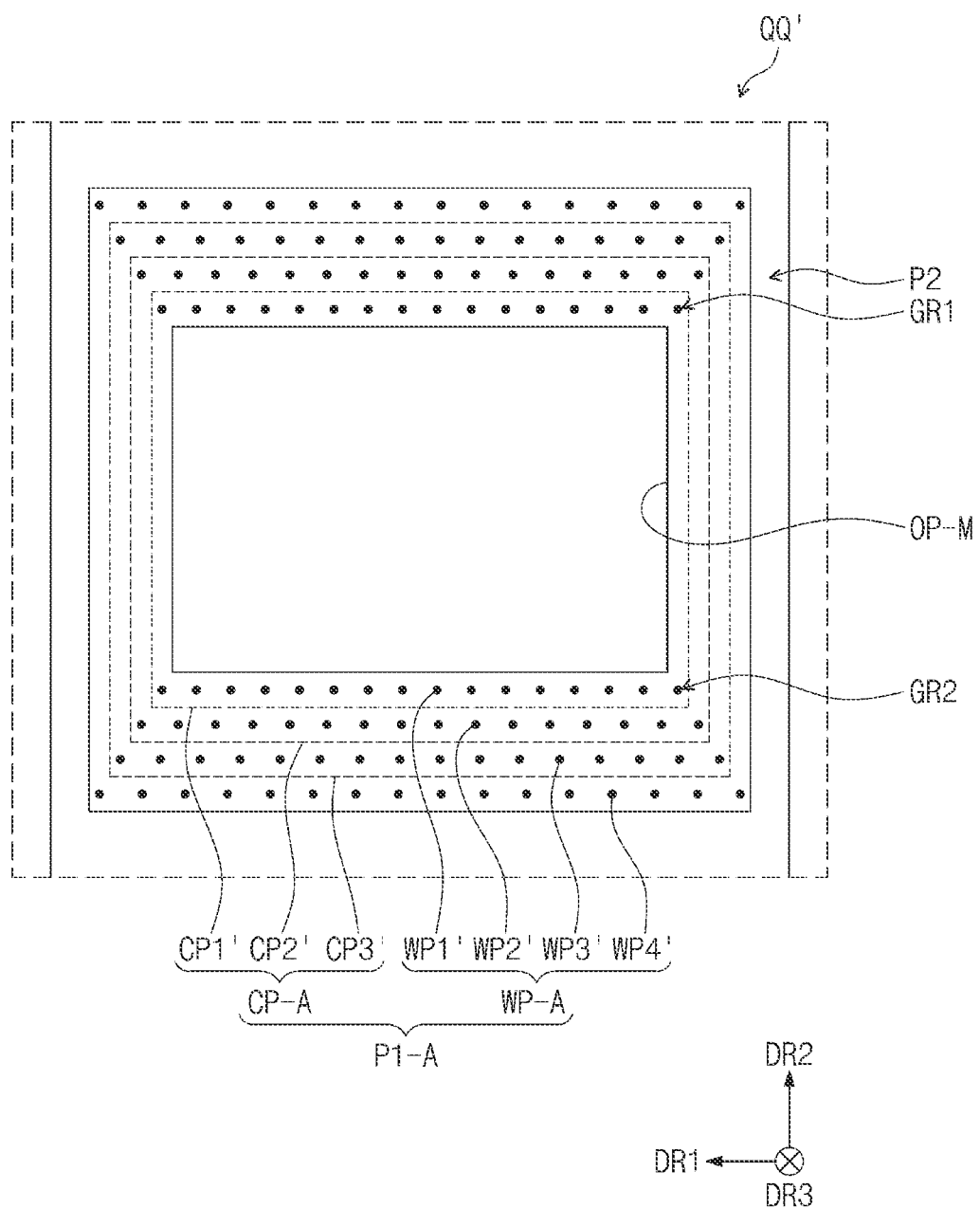
FIG. 10B is an enlarged plan view of area QQ' of FIG. 10A.

FIG. 9 is an exploded perspective view of a mask assembly MSA-A according to an embodiment of the disclosure. FIG. 10A is a plan view of an open mask OM-A according to an embodiment of the disclosure. FIG. 10B is an enlarged plan view of area QQ' of FIG. 10A. In FIGS. 9, 10A, and 10B, the same/similar reference numerals denote the same/similar elements in FIGS. 1 to 8, and thus, detailed descriptions of the same/similar elements will be omitted.

Referring to FIG. 9, the mask assembly MSA-A may include a frame FR, an open mask OM-A, and a unit mask UM.

In the embodiment, the open mask OM-A may be provided in plural. Each of the open masks OM-A may extend in the second direction DR2, and the open masks OM-A may be arranged in the first direction DR1.

Each of the open masks OM-A may include multiple openings OP-M. The openings OP-M may be arranged in a line along the direction in which the open masks OM-A extend. For example, the openings OP-M may be arranged in the second direction DR2.

The unit mask UM may be provided in plural, and the unit masks UM may be disposed on an upper surface U-MA of each of the open masks OM-A. Each of the unit masks UM may be disposed to overlap a corresponding opening among the openings OP-M. Accordingly, the unit masks UM disposed on one open mask OM-A may be arranged in a line along the direction in which the open mask OM-A extends, i.e., along the second direction DR2.

FIG. 10A shows one open mask among the open masks OM-A shown in FIG. 9 and is a plan view of the open mask OM-A viewed from a lower surface L-MA of the open mask OM-A. Each of the open masks OM-A may include first portions P1-A and a second portion P2. The second portion P2 may surround the first portions P1-A.

The openings OP-M included in the open masks OM-A may be defined by the first portions P1-A. In the embodiment, the first portions P1-A may be arranged in the second direction DR2 in one open mask OM-A.

According to the embodiment, a width W1 in the first direction DR1 of the first portions P1-A may be different from a width W2 in the second direction DR2 of the first portions P1-A. For example, the width W1 in the first direction DR1 of the first portions P1-A may be smaller than the width W2 in the second direction DR2 of the first portions P1-A.

FIG. 10B is an enlarged plan view of the first portion P1-A of the open mask OM-A (refer to FIG. 10A). Referring to FIG. 10B, the first portion P1-A may include a welding portion WP-A and a cutting portion CP-A.

According to an embodiment, the welding portion WP-A may include a first welding portion WP1', a second welding portion WP2', a third welding portion WP3', and a fourth welding portion WP4', which are sequentially arranged in a direction away from the opening OP-M.

According to an embodiment, each of the first, second, third, and fourth welding portions WP1', WP2', WP3', and WP4' may be arranged along long sides extending in the first direction DR1 among four sides of the opening OP-M. For example, each of the first, second, third, and fourth welding portions WP1', WP2', WP3', and WP4' may be grouped into a first group GR1 disposed along one long side among the long sides of the opening OP-M and a second group GR2 disposed along the other long side among the long sides of the opening OP-M. The first group GR1 and the second group GR2 may be spaced apart from each other in the second direction DR2 with the opening OP-M interposed therebetween.

According to an embodiment, a cutting portion CP-A may include a first cutting portion CP1', a second cutting portion CP2', and a third cutting portion CP3', which are sequentially arranged in a direction away from the opening OP-M.

According to the embodiment, the first, second, third, and fourth welding portions WP1', WP2', WP3', and WP4' may not be disposed in an area (hereinafter, referred to as a side area) between a portion extending in the second direction DR2 of an inner side surface of the open mask OM-A defining the opening OP-M and an outer side surface of the open mask OM-A extending in the second direction DR2, and thus, a distance between the cutting portions adjacent to each other among the first, second, and third cutting portions CP1', CP2', and CP3' may decrease. Accordingly, the width W1 (refer to FIG. 10A) in the first direction DR1 of the first portion P1-A may be reduced.

Accordingly, even though there is a limit to the distance of the side area by arranging the multiple open masks OM-A, the open masks OM-A may be cut multiple times, and the mask assembly MSA-A may be repaired multiple times.

Figure 11:
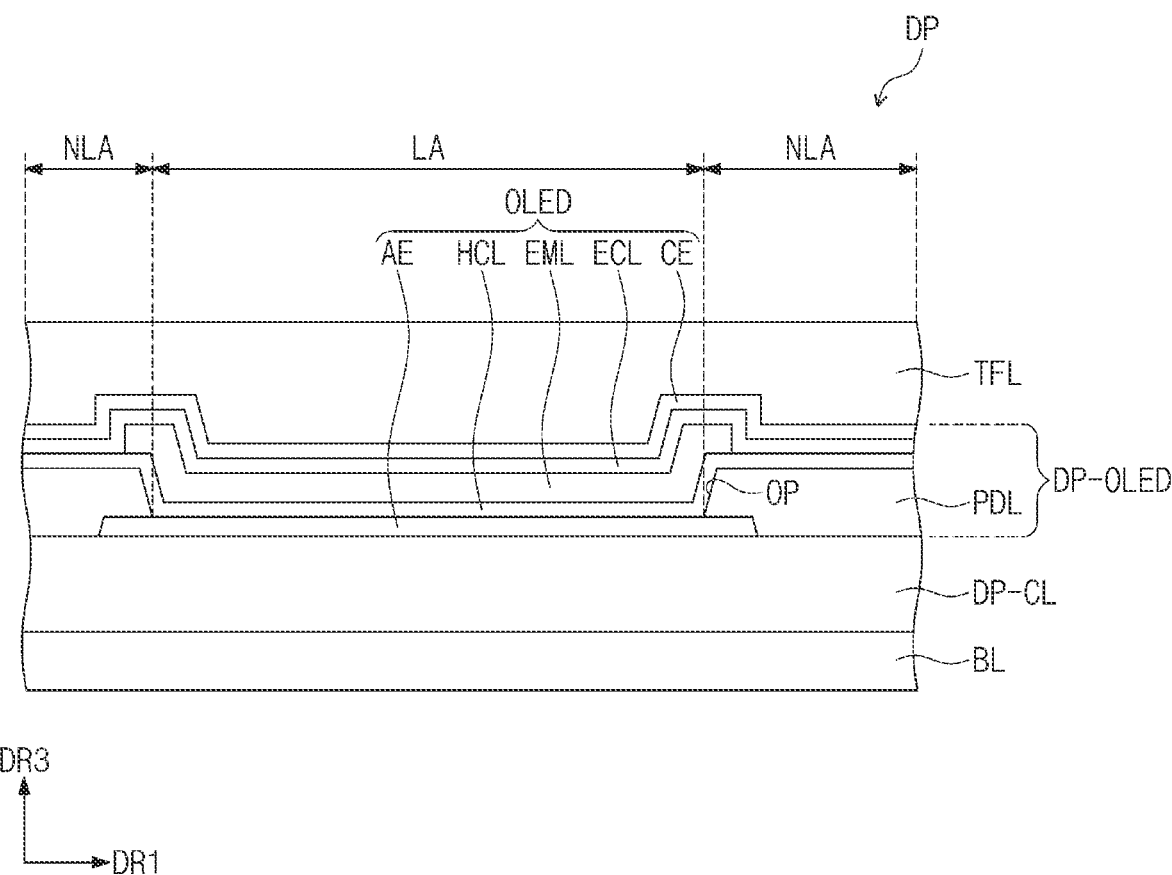
FIG. 11 is a schematic cross-sectional view of a display panel according to an embodiment of the disclosure.

FIG. 11 is a schematic cross-sectional view of the display panel DP according to an embodiment of the disclosure.

In the embodiment, the display panel DP may be a light emitting type display panel. The display panel DP may be one of an inorganic light emitting display panel and an organic light emitting display panel, however, it should not be particularly limited.

According to an embodiment, the display panel DP may include a base layer BL, a circuit element layer DP-CL disposed on the base layer BL, a display element layer DP-OLED disposed on the circuit element layer DP-CL, and an encapsulation layer TFL disposed on the display element layer DP-OLED.

The base layer BL may be a glass substrate, a metal substrate, or a polymer substrate, however, it should not be limited thereto or thereby. The base layer BL may include an inorganic layer, an organic layer, or a composite material layer.

The circuit element layer DP-CL may include at least one insulating layer and a circuit element. The circuit element may include a signal line and a driving circuit of the pixel. The circuit element layer DP-CL may be formed by forming an insulating layer, a semiconductor layer, and a conductive layer using a coating or depositing process and patterning the insulating layer, the semiconductor layer, and the conductive layer using a photolithography process.

The display element layer DP-OLED may include a pixel definition layer PDL and a light emitting element OLED. The light emitting element OLED may be an organic light emitting diode or a quantum dot light emitting diode.

A first electrode AE may be disposed on the circuit element layer DP-CL. The pixel definition layer PDL may be provided with an opening OP defined therethrough to expose at least a portion of the first electrode AE. The opening OP of the pixel definition layer PDL may define a light emitting area LA. A non-light-emitting area NLA may surround the light emitting area LA.

A hole control layer HCL, an electron control layer ECL, and a second electrode CE may be commonly disposed in the light emitting area LA and the non-light-emitting area NLA. The hole control layer HCL and the electron control layer ECL may be commonly formed in the pixels using a mask different from the mask assemblies MSA and MSA-A (refer to FIGS. 2 and 9) described in the disclosure.

A light emitting layer EML may be patterned to correspond to the opening OP. The light emitting layer EML having a shape may be formed using the mask assembly MSA or MSA-A described above.

However, the disclosure should not be limited to the embodiments described above, and any component of the display panel DP may be formed using the deposition apparatus EDA (refer to FIG. 1) as long as the component may be deposited though the mask assembly MSA or MSA-A.

The encapsulation layer TFL may be disposed on the light emitting element OLED. The encapsulation layer TFL may include multiple thin layers. The thin layers may include an inorganic layer and an organic layer. The encapsulation layer TFL may include an insulating layer to encapsulate the display element layer DP-OLED and an insulating layer to improve a light emission efficiency.

Although the embodiments of the disclosure have been described, it is understood that the disclosure should not be limited to these embodiments but various changes and modifications can be made by one ordinary skilled in the art within the spirit and scope of the disclosure as hereinafter claimed.

Therefore, the disclosed subject matter should not be limited to any single embodiment described herein, and the scope of the disclosure shall be determined according to the attached claims.

What is claimed is:

1. A method of repairing a mask assembly, comprising:
   providing a mask assembly comprising:
      a frame;

an open mask including a first opening, the open mask disposed on an upper surface of the frame; and a first unit mask including a plurality of first deposition openings overlapping the first opening in a plan view, the first unit mask disposed on an upper surface of the open mask;

first cutting the open mask at an outside of the first unit mask such that a second opening having a size greater than a size of the first opening is defined; and connecting a second unit mask including a plurality of second deposition openings corresponding to the plurality of first deposition openings to the first cut open mask.

2. The method of claim 1, wherein the first unit mask is separated from the mask assembly by the first cutting of the open mask.

3. The method of claim 1, wherein the open mask is cut in a direction from the upper surface to a lower surface of the open mask or from the lower surface to the upper surface of the open mask by the first cutting of the open mask.

4. The method of claim 1, wherein the first cutting of the open mask is performed by a laser cutting process.

5. The method of claim 1, further comprising:

second cutting the first cut open mask at an outside of the second unit mask to have a third opening having a size greater than the size of the second opening after the connecting of the second unit mask to the first cut open mask.

6. The method of claim 1, wherein the open mask comprises:
 a first portion including the first opening; and
 a second portion surrounding the first portion and having a thickness greater than a thickness of the first portion in a thickness direction of the open mask, the first unit mask is disposed on the first portion, and
in the first cutting of the open mask, a portion of the first portion is cut and separated from the mask assembly.

7. The method of claim 6, wherein the first portion has a length in a range of about 300 micrometers to about 2 millimeters in a cross-sectional view.

8. The method of claim 6, wherein the first portion has the thickness equal to or smaller than about 100 micrometers in the thickness direction.

9. The method of claim 1, wherein in the first cutting of the open mask, at least one of an inner side surface of the first unit mask which defines the plurality of first deposition openings, a lower surface of the first unit mask which is in contact with the open mask, and an upper surface of the first unit mask which is opposite to the lower surface, is damaged or a deposition material is accumulated in some of the plurality of first deposition openings.

10. The method of claim 1, further comprising:
manufacturing the mask assembly before the providing of the mask assembly, wherein
the manufacturing of the mask assembly comprises:
 disposing a first preliminary unit mask comprising:
  a first deposition area comprising the plurality of first deposition openings; and
  a first peripheral area surrounding the first deposition area on the open mask;

connecting the first preliminary unit mask to the open mask such that a first welding protrusion is formed on a lower surface of the open mask adjacent to the first opening; and cutting the first preliminary unit mask along a first trimming line defined in the first peripheral area to form the first unit mask, and the first trimming line is a closed line surrounding the first deposition area in a plan view.

11. The method of claim 10, wherein the open mask comprises:
 a first portion including the first opening; and
 a second portion surrounding the first portion and having a thickness greater than a thickness of the first portion in a thickness direction of the open mask, the first unit mask is disposed on the first portion, and
the first trimming line is defined between a portion overlapping the first welding protrusion in a plan view and a boundary of the first portion and the second portion.

12. The method of claim 10, wherein the first preliminary unit mask is disposed such that the first peripheral area is covered by the open mask when viewed from under the lower surface of the open mask.

13. The method of claim 10, wherein the first preliminary unit mask has a quadrangular shape extending in a first direction and a second direction intersecting the first direction in a plan view and is connected to the open mask after being tensioned in at least one direction of the first and second directions.

14. The method of claim 10, wherein the connecting of the second unit mask to the first cut open mask comprises:
 disposing a second preliminary unit mask comprising a second deposition area comprising the plurality of second deposition openings and a second peripheral area surrounding the second deposition area on the first cut open mask;
 connecting the second preliminary unit mask to the first cut open mask such that a second welding protrusion is formed on the lower surface of the first cut open mask adjacent to the second opening; and
 cutting the second preliminary unit mask along a second trimming line defined in the second peripheral area to form the second unit mask, and
the second trimming line is a closed line surrounding the second deposition area in a plan view.

15. The method of claim 14, wherein the open mask comprises:
 a first portion including the first opening; and
 a second portion surrounding the first portion and having a thickness greater than a thickness of the first portion, the first unit mask is disposed on the first portion,
the second trimming line is defined between a portion overlapping the second welding protrusion in a plan view and a boundary of the first portion and the second portion.

16. The method of claim 14, wherein the first preliminary unit mask and the second preliminary unit mask have a same length in a cross-sectional view.

* * * * *